United States Patent
Ota et al.

(10) Patent No.: US 7,312,665 B2
(45) Date of Patent: Dec. 25, 2007

(54) OSCILLATION CONTROL APPARATUS

(75) Inventors: Kosuke Ota, Machida (JP); Takayuki Shimazu, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 34 days.

(21) Appl. No.: 11/302,247

(22) Filed: Dec. 14, 2005

(65) Prior Publication Data

US 2006/0139107 A1    Jun. 29, 2006

(30) Foreign Application Priority Data

Dec. 15, 2004  (JP) ............................. 2004-363702

(51) Int. Cl.
*H03L 7/00* (2006.01)
(52) U.S. Cl. .................... 331/16; 455/260; 331/177 V
(58) Field of Classification Search ................. 331/16, 331/177 V; 455/260
See application file for complete search history.

(56) References Cited

U.S. PATENT DOCUMENTS 6,323,739 B1 * 11/2001 Andrews ................ 331/117 R

FOREIGN PATENT DOCUMENTS

JP       10-271002       10/1998

OTHER PUBLICATIONS

Transistor Technology, Jun. 1999 Issue, vol. 36, No. 417, p. 230, with English language translation.

* cited by examiner

*Primary Examiner*—Arnold Kinkead
(74) *Attorney, Agent, or Firm*—Greenblum & Bernstein, P.L.C.

(57) ABSTRACT

In a PLL comprising a voltage controlled oscillator (VCO) equipped with a variable resonator, a frequency divider, a phase comparator, and an low pass filter (LPF), a variable resonator control signal generation section has the output voltage of the LPF as an input, detects a f/v sensitivity of the VCO, generates a variable resonator control signal, and controls a capacitance of the variable resonator by the variable resonator control signal. In a disclosed embodiment, when a voltage detection circuit having the output voltage of the LPF as an input detects a predetermined voltage, a data latch circuit transmits a variable resonator control signal based on the voltage detected by voltage detection circuit to variable resonator and performs a variable capacitance control. As a result, the f/v sensitivity of the VCO can be controlled to an optimal value even in the event of PLL configuration element variation or temperature changes.

10 Claims, 18 Drawing Sheets

| INPUT CONDITION | COMPARATOR OUTPUT SIGNAL | |
|---|---|---|
| | $D_1$ | $D_2$ |
| $Vt < VR_1$ | L | L |
| $VR_1 \leqq Vt < VR_2$ | H | L |
| $VR_2 \leqq Vt$ | H | H |

FIG.4

|  | DATA FLIP-FLOP OUTPUT | | VARIABLE RESONATOR INPUT | | |
|---|---|---|---|---|---|
| $D_1$ | $D_2$ | $Q_1$ | $Q_2$ | $S_1$ | $S_2$ | $S_3$ |
| L | L | L | L | H | L | L |
| H | L | H | L | L | H | L |
| H | H | H | H | L | L | H |

OSCILLATION CONTROL APPARATUS

BACKGROUND OF THE INVENTION

1. Field of the Invention

The present invention relates to an oscillation control apparatus that performs oscillation control of a VCO (Voltage Controlled Oscillator) which is a configuration element of a PLL (Phase Locked Loop), and more particularly to an oscillation control apparatus that detects and automatically adjusts f/v sensitivity, f/v being the ratio of oscillation frequency f to VCO control voltage v.

2. Description of the Related Art

A conventional general oscillation control apparatus employs a control method whereby oscillation control is performed without automatically adjusting the f/v sensitivity of a VCO. See, for example, Non-Patent Document 1 (Transistor Technology (June 1996 issue, Vol. 36, No. 417, P230)).

FIG. 20 is a block diagram showing the configuration of a conventional oscillation control apparatus that has virtually the same configuration as in Non-Patent Document 1. This oscillation control apparatus comprises VCO 41 provided with resonator 41a and oscillator 41b, frequency divider 42, phase comparator 43, and low-pass filter (LPF) 44. Phase comparator 43 compares the phases of reference signal $f_0$ and an output signal $f_1$ of frequency divider 42 that divides the output frequency of VCO 41, and outputs output signal $f_2$ in accordance with the phase difference to LPF 44. LPF 44 performs integration of output signal $f_2$ from phase comparator 43 and eliminates an unnecessary high-frequency component, and outputs a control voltage of resonator 41a of VCO 41. Then oscillator 41b functions as a PLL by oscillating at the resonance frequency of resonator 41a based on that control voltage.

A technology has also been disclosed whereby the operating environment and manufacturing variation are identified by detecting the VCO control voltage, and the optimal oscillation frequency band and frequency divider division ratio are selected from the plurality of oscillation frequency bands with which the VCO is provided, according to that identification. See, for example, Patent Document 1 (Unexamined Japanese Patent Publication No. HEI10-271002).

However, with the above-described conventional technology, if the f/v sensitivity of the VCO varies due to configuration element variation, temperature changes, or the like, the C/N (Carrier to Noise ratio) may degrade, or the frequency variability range may be narrowed. FIG. 21 is a graph showing variation of f/v sensitivity in a conventional VCO, with input voltage (V) represented on the horizontal axis and output frequency (Hz) on the vertical axis. That is to say, this graph shows the degree of change of the frequency change width due to f/v sensitivity variation in the conventional VCO. In this graph, taking f/v sensitivity reference characteristic A as the optimal slope of the f/v sensitivity of the VCO, if the f/v sensitivity varies in the downward direction as shown by low f/v sensitivity characteristic B, the frequency variability range narrows, and if the f/v sensitivity varies in the upward direction as shown by high f/v sensitivity characteristic A, the C/N ratio of the VCO degrades.

SUMMARY OF THE INVENTION

It is therefore an object of the present invention to provide an oscillation control apparatus that can provide stable operation of a VCO and prevent degradation of characteristics, such as C/N degradation, by correcting variation of the f/v sensitivity of the VCO.

According to an aspect of the invention, an oscillation control apparatus equipped with a PLL comprising: a voltage controlled oscillator that has a variable resonator that changes f/v sensitivity according to a control signal; a frequency divider that performs a frequency division of a frequency of an entered output signal of said voltage controlled oscillator; a phase comparator that performs phase comparison between an entered output signal of said frequency divider and a entered reference signal; and a low-pass filter receiving an output signal of said phase comparator and outputs a control voltage to said voltage controlled oscillator, wherein said oscillation control apparatus has a variable resonator control signal generation section that has an output signal of said low-pass filter as input and detects f/v sensitivity of said voltage controlled oscillator, and generates a control signal for controlling said variable resonator based on detected f/v sensitivity.

According to another aspect of the invention, an oscillation control apparatus is equipped with a PLL composed of a voltage controlled oscillator that has a variable resonator that changes f/v sensitivity according to a control signal; a frequency divider that has an output signal of the aforementioned voltage controlled oscillator as input, and performs frequency division; a phase comparator that has an output signal of the aforementioned frequency divider and a reference signal as input, and performs phase comparison; and a low-pass filter that has an output signal of the aforementioned phase comparator as input, and outputs a control voltage to the aforementioned voltage controlled oscillator; wherein the aforementioned oscillation control apparatus is equipped with a voltage detection circuit that has an output signal of the aforementioned low-pass filter as input, and detects a predetermined voltage; a CPU that has an output signal of the aforementioned voltage detection circuit as input, and outputs predetermined serial data in accordance with the detection result; and a serial decoder that has an output signal of the aforementioned CPU as input, and outputs a control signal to the aforementioned resonator.

According to another aspect of the invention, an f/v sensitivity adjustment method of an oscillation control apparatus that performs adjustment of f/v sensitivity in a voltage controlled oscillator has the steps of: detecting variation of f/v sensitivity of the aforementioned voltage controlled oscillator; and adjusting the aforementioned f/v sensitivity to an optimal value based on a detection result.

According to still another aspect of the invention, an f/v sensitivity adjustment method of an oscillation control apparatus that performs adjustment of f/v sensitivity in a voltage controlled oscillator has the steps of: setting a PLL circuit to a reference frequency; setting an output signal of a low-pass filter included in the aforementioned PLL circuit to a reference voltage at the aforementioned reference frequency; setting the aforementioned PLL circuit to a detection frequency; detecting the output voltage of the aforementioned low-pass filter, and detecting f/v sensitivity based on an operating threshold value; maintaining a detection result as a control signal; and a step of adjusting the aforementioned f/v sensitivity to an optimal value for the aforementioned voltage controlled oscillator based on the aforementioned control signal.

BRIEF DESCRIPTION OF THE DRAWINGS

The above and other objects and features of the invention will appear more fully hereinafter from a consideration of the following description taken in conjunction with the accompanying drawings, in which:

FIG. 4 is a drawing showing an operation table of the voltage detection circuit shown in FIG. 3;

DESCRIPTION OF THE PREFERRED EMBODIMENTS

Figure 1:
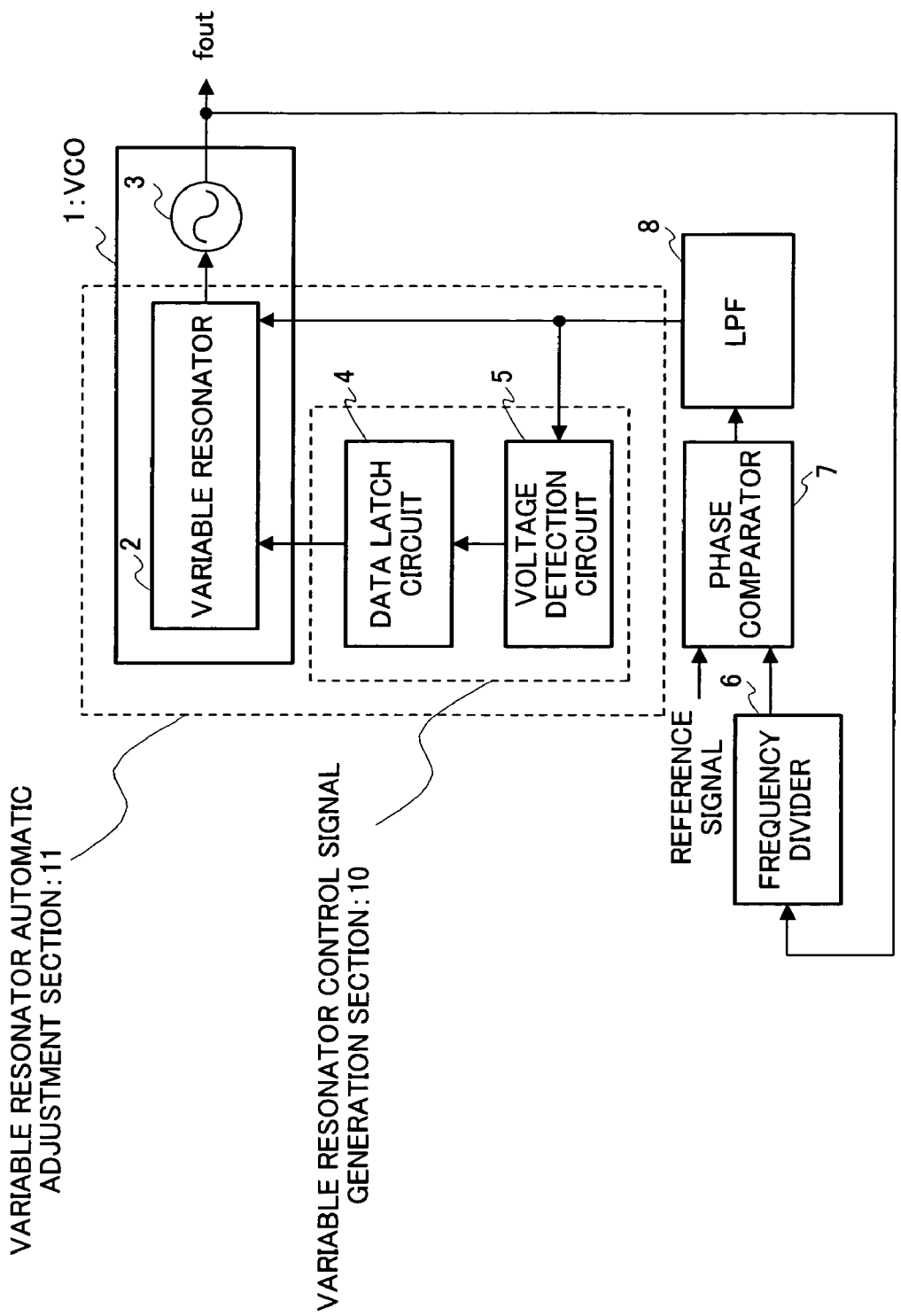
FIG. 1 is a block diagram showing the configuration of an oscillation control apparatus according to Embodiment 1 of the present invention.

With reference now to the accompanying drawings, preferred embodiments of the present invention will be explained in detail below.

An oscillation control apparatus of the present invention is composed of at least a variable resonator that changes the resonance frequency change width in accordance with a control signal, a voltage controlled oscillator (VCO) that has an oscillator that oscillates at the resonance frequency of that variable resonator, and a variable resonator control signal generation section that has an output signal of a low-pass filter (LPF) as input, detects the f/v sensitivity of the VCO, and generates a variable resonator control signal. By means of such a configuration the variable resonator control signal generation section generates control signals so that when the f/v sensitivity of the VCO varies in the downward direction, the change width of the resonance frequency of the variable resonator is increased and the f/v sensitivity is raised so that the f/v sensitivity becomes a reference value, and when the f/v sensitivity of the VCO varies in the upward direction, the change width of the resonance frequency of the variable resonator is decreased and the f/v sensitivity is lowered so that the f/v sensitivity becomes the reference value. By thus correcting f/v sensitivity variation of the VCO, and preventing characteristic degradation such as PLL C/N sensitivity degradation and narrowing of the frequency selection range, stabilization of operation as a PLL and prevention of characteristic degradation are achieved. In the drawings used in the embodiments, the same reference numerals are assigned to identical configuration elements, and duplicate descriptions are omitted as far as possible.

Embodiment 1

FIG. 1 is a block diagram showing the configuration of an oscillation control apparatus according to Embodiment 1 of the present invention.

The oscillation control apparatus shown in FIG. 1 comprises a VCO 1 provided with variable resonator 2 and oscillator 3, data latch circuit 4, voltage detection circuit 5, frequency divider 6, phase comparator 7, and low-pass filter (LPF) 8. Variable resonator control signal generation section 10 is composed of data latch circuit 4 and voltage detection circuit 5, and a variable resonator automatic adjustment section 11 is composed of variable resonator 2 of VCO 1 and variable resonator control signal generation section 10. Furthermore, a well-known PLL is composed of frequency divider 6, phase comparator 7, LPF 8 and VCO 1. That is to say, a feature of an oscillation control apparatus according to Embodiment 1 is the configuration of variable resonator control signal generation section 10 and variable resonator automatic adjustment section 11.

That is to say, variable resonator automatic adjustment section 11 is composed of variable resonator 2 that changes the resonance frequency change width in accordance with a control signal, and variable resonator control signal generation section 10 that has an output signal of PLL configuration element LPF 8 as input, detects the f/v sensitivity of VCO 1, and generates a variable resonator 2 control signal. Variable resonator control signal generation section 10 has a function of generating a control signal that increases the change width of the resonance frequency of variable resonator 2 and raises the f/v sensitivity of VCO 1 when the f/v sensitivity of VCO 1 varies in the downward direction, and decreases the change width of the resonance frequency of variable resonator 2 and lowers the f/v sensitivity of VCO 1 when the f/v sensitivity of VCO 1 varies in the upward direction. In the oscillation control apparatus of Embodiment 1, data latch circuit 4 and voltage detection circuit 5 of variable resonator control signal generation section 10 do not function individually.

Next, the operation whereby the f/v sensitivity of the VCO is controlled to an optimal value by the oscillation control apparatus shown in FIG. 1 will be described.

Figure 2:
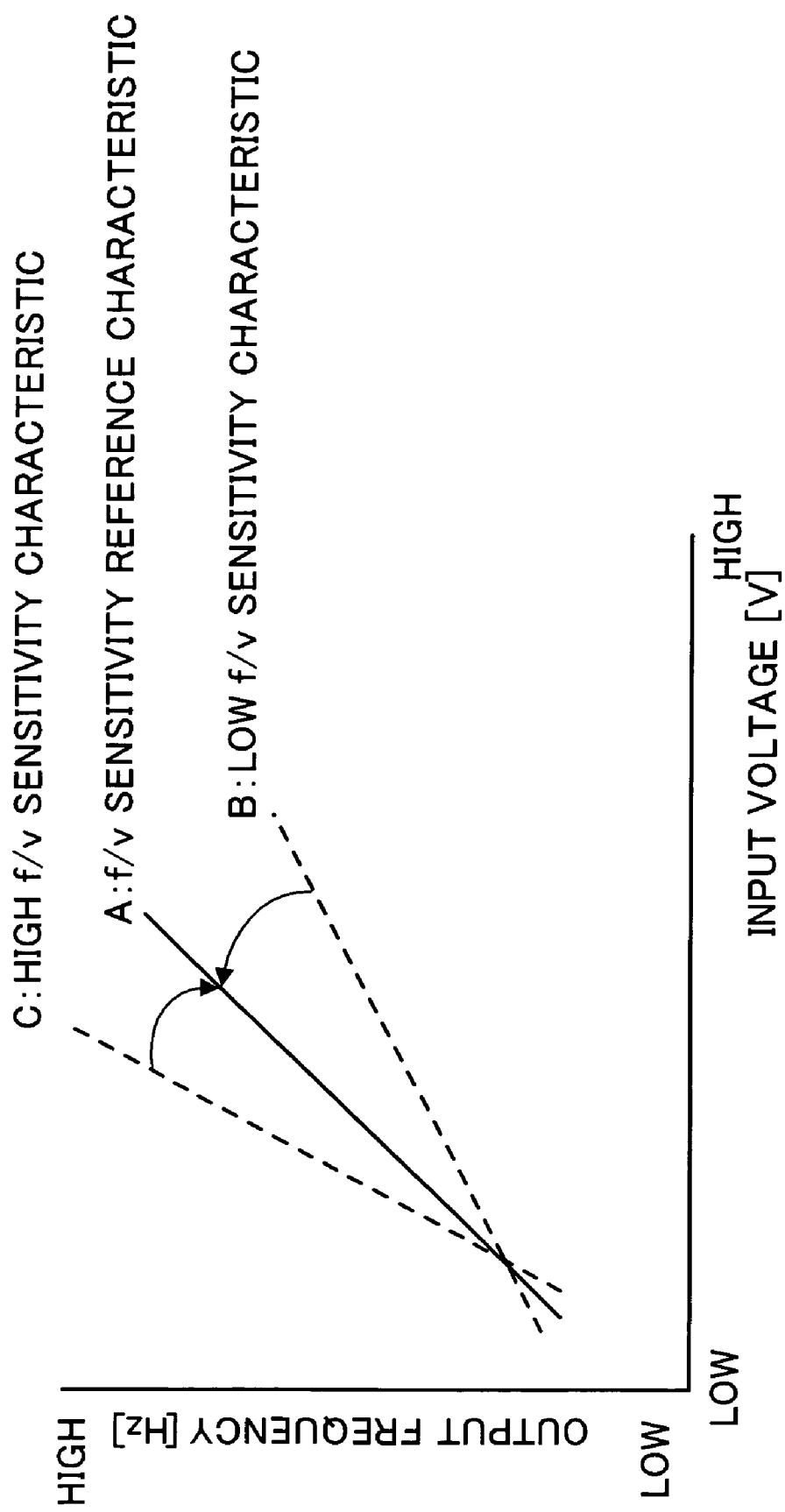
FIG. 2 is a graph of the VCO f/v sensitivity characteristic realized by an oscillation control apparatus of the present invention.

FIG. 2 is a graph of the VCO f/v sensitivity characteristic realized by an oscillation control apparatus of the present invention, with input voltage (V) represented on the horizontal axis and output frequency (Hz) on the vertical axis. That is to say, as shown in FIG. 2, through the control of variable resonator automatic adjustment section 11 of the oscillation control apparatus in FIG. 1, in the case of characteristic B in which the f/v sensitivity of the VCO varies in the downward direction, control is performed so that the frequency variability range is prevented from narrowing by increasing the resonance frequency change width of variable resonator 2, and becomes the predetermined frequency bandwidth indicated by f/v sensitivity reference characteristic A. On the other hand, in the case of characteristic C in which the f/v sensitivity of the VCO varies in the upward direction, control is performed so that the frequency variability range is prevented from widening by decreasing the resonance frequency change width of variable resonator 2, and becomes the predetermined frequency bandwidth indicated by f/v sensitivity reference characteristic A.

To give a more detailed explanation, data latch circuit 4 feeds back the f/v sensitivity of the VCO to variable resonator 2, and in the case of VCO f/v sensitivity variation, automatic adjustment is performed so that f/v sensitivity reference characteristic A is attained. That is to say, in the case of low f/v sensitivity characteristic B, automatic adjustment is performed so that the capacitance value at the time of voltage controlled capacitance Vmin is made larger than the capacitance value of a fixed capacitance and f/v sensitivity is made optimal, attaining f/v sensitivity reference characteristic A. On the other hand, in the case of high f/v sensitivity characteristic C, automatic adjustment is performed so that the capacitance value at the time of voltage controlled capacitance Vmin is made smaller than the capacitance value of a fixed capacitance and f/v sensitivity is made optimal, attaining f/v sensitivity reference characteristic A. By having variable resonator automatic adjustment section 11 perform automatic adjustment of the f/v sensitivity of the VCO in this way, stable PLL operation can be achieved, and characteristic degradation such as degradation of C/N sensitivity and narrowing of the frequency selection range can be prevented.

Embodiment 2

The configuration of an oscillation control apparatus according to Embodiment 2 of the present invention is the same as the configuration of the oscillation control apparatus of Embodiment 1 shown in FIG. 1, but in Embodiment 2 the function of variable resonator control signal generation section 10 is changed. Therefore, the interior of variable resonator control signal generation section 10 will be described in detail using FIG. 1.

In Embodiment 2, variable resonator control signal generation section 10 is composed of voltage detection circuit 5 that has an output signal of PLL configuration element LPF 8 as input and detects a predetermined threshold voltage, and data latch circuit 4 that has an output signal of voltage detection circuit 5 as input, holds data, and outputs a control signal to variable resonator 2.

Next, the operation whereby variable resonator control signal generation section 10 detects the f/v sensitivity of VCO 1 and outputs a control signal will be described.

When VCO 1 output signal is made a reference frequency, the input signal is adjusted so that a loop operates as a PLL at the reference voltage. Then, as a test mode, the output signal of LPF 8 when VCO 1 is set to the detection frequency is detected by voltage detection circuit 5 of variable resonator control signal generation section 10, and the result of comparison with a predetermined threshold voltage is output to data latch circuit 4. Data latch circuit 4 then holds the signal from voltage detection circuit 5, outputs this signal to variable resonator 2 as a control signal, and terminates test mode. The f/v sensitivity of the VCO is controlled to an optimal value by having data latch circuit 4 of variable resonator control signal generation section 10 output this kind of control signal to variable resonator 2.

Embodiment 3

Figure 3:
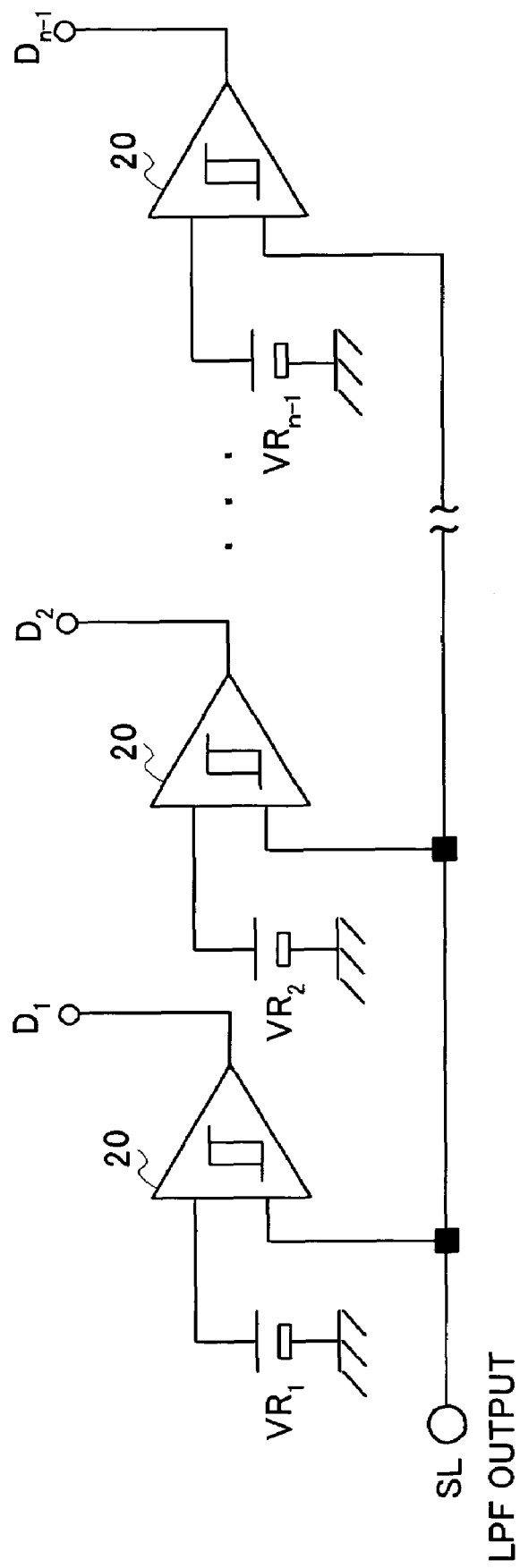
FIG. 3 is a circuit diagram showing an example of a voltage detection circuit according to Embodiment 3 of the present invention.

FIG. 3 is a circuit diagram showing an example of a voltage detection circuit according to Embodiment 3 of the present invention. That is to say, the voltage detection circuit shown in FIG. 3 shows the internal configuration of voltage detection circuit 5 in FIG. 1. As shown in FIG. 3, voltage detection circuit 5 is composed of numerous comparators 20, and one input terminal of each comparator 20 is connected to LPF output SL. The other input terminal of comparators 20 is connected to threshold value 1 voltage source $VR_1$, threshold value 2 voltage source $VR_2$, . . . , threshold value (n-1) voltage source $VR_{n-1}$, respectively. Comparator 1 output $D_1$, comparator 2 output $D_2$, . . . , comparator (n-1) output $D_{n-1}$ output signals are sent from the output terminal of the respective comparators 20.

That is to say, (n-1) comparators 20 are connected, to one input terminal of each of which the LPF output SL voltage is input in common, to the other input terminal of each of which the voltage from threshold value 1 voltage source $VR_1$, threshold value 2 voltage source $VR_2$, threshold value (n-1) voltage source $VR_{n-1}$, respectively, is input, and from which comparator 1 output $D_1$, comparator 2 output $D_2$, . . . , comparator (n-1) output $D_{n-1}$ output signals, respectively, are output.

FIG. 4 is a drawing showing an operation table of the voltage detection circuit shown in FIG. 3. That is to say, this figure shows a table of input/output characteristics of voltage detection circuit 5 to which two comparators 20 are connected and that detects a binary threshold value. When LPF 8 output voltage Vt is less than threshold value 1 voltage source $VR_1$ (that is, $Vt<VR_1$), comparator 1 output $D_1$ is L, and comparator 2 output $D_2$ is L. When LPF output voltage Vt is greater than or equal to threshold value 1 voltage source $VR_1$ and less than threshold value 2 voltage source $VR_2$ (that is, $VR_1 \leq Vt<VR_2$), comparator 1 output $D_1$ is H, and comparator 2 output $D_2$ is L. When LPF output voltage Vt is greater than or equal to threshold value 2 voltage source $VR_2$ (that is, $VR_2 \leq Vt$), comparator 1 output $D_1$ is H, and comparator 2 output $D_2$ is H. In this way comparators 20 can send a comparator output signal in accordance with a detected voltage.

Embodiment 4

Figure 5:
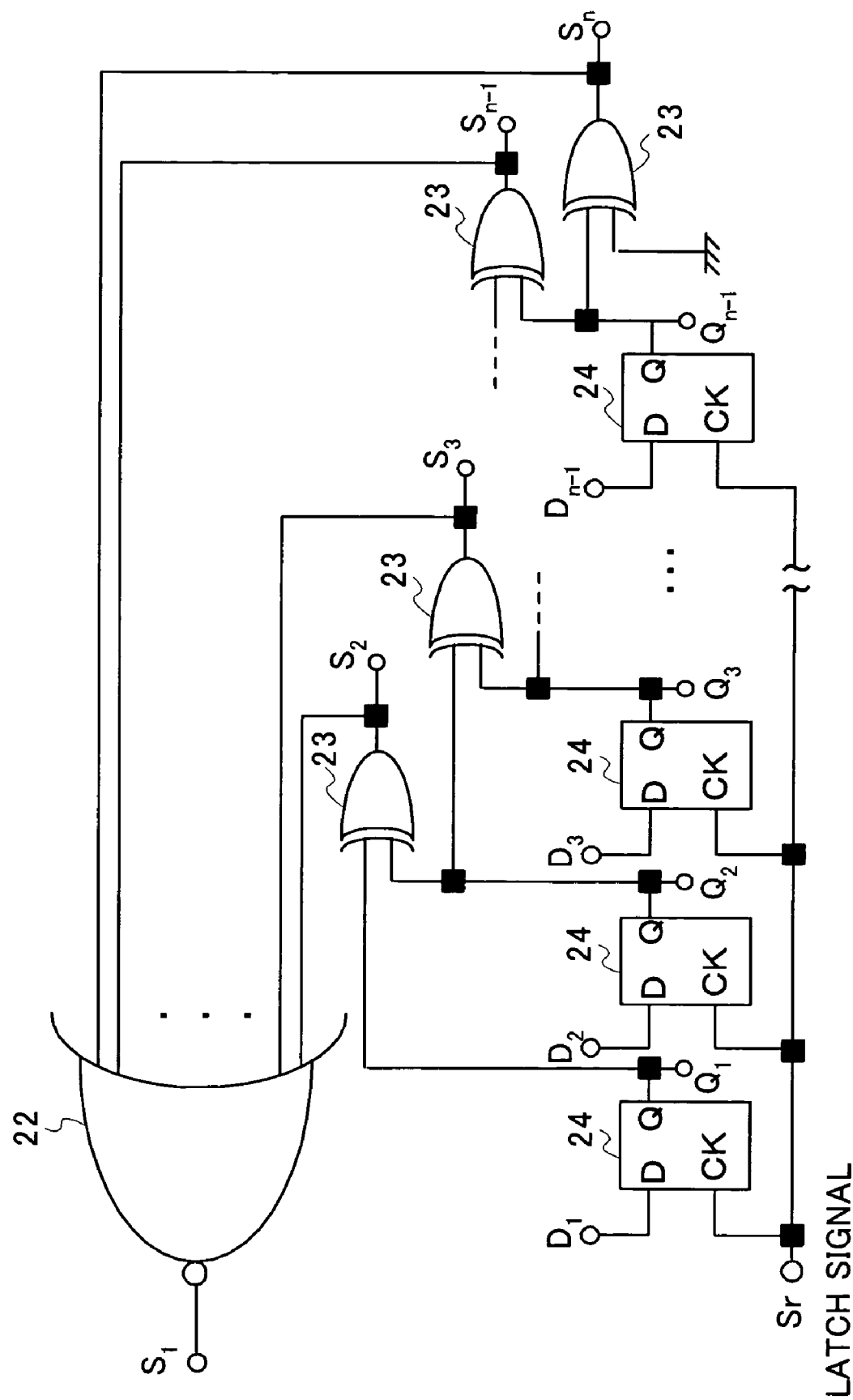
FIG. 5 is a drawing showing an example of a data latch circuit according to Embodiment 4 of the present invention.

FIG. 5 is a drawing showing an example of a data latch circuit according to Embodiment 4 of the present invention. That is to say, the data latch circuit shown in FIG. 5 shows the internal configuration of data latch circuit 4 in FIG. 1. The data latch circuit shown in FIG. 5 is composed of one NAND 22, a plurality of EXORs (Exclusive ORs) 23, and a plurality of data flip-flops (DFFs) 24. Sr is a latch signal, $Q_1$ is the data flip-flop 1 output, $Q_2$ is the data flip-flop 2 output, $Q_3$ is the data flip-flop 3 output, $Q_{n-1}$ is the data flip-flop (n−1) output, $S_1$ is the variable resonator control signal 1 output, $S_2$ is the variable resonator control signal 2 output, $S_{n-1}$ is the variable resonator control signal (n−1) output, and $S_n$ is the variable resonator control signal n output.

Latch signal Sr is used as the data latch circuit clock input, to which (n−1) data flip-flops 24 are connected. To the data inputs of the (n−1) data flip-flops 24 are connected the respective outputs of the (n-1) comparators 20 shown in FIG. 3: comparator 1 output $D_1$, comparator 2 output $D_2$, comparator 3 output $D_3$, . . . , comparator (n-1) output $D_{n-1}$. The outputs of the (n-1) data flip-flops 24 are data flip-flop 1 output $Q_1$, data flip-flop 2 output $Q_2$, data flip-flop 3 output $Q_3$, . . . , data flip-flop (n-1) output $Q_{n-1}$.

Taking a rising edge of data signal Sr as a trigger, data flip-flops 24 output signals input from the outputs of the (n-1) comparators 20 shown in FIG. 3—comparator 1 output $D_1$, comparator 2 output $D_2$, comparator 3 output $D_3$, . . . , comparator (n-1) output $D_{n-1}$—to data flip-flop 1 output $Q_1$, data flip-flop 2 output $Q_2$, data flip-flop 3 output $Q_3$, . . . , data flip-flop (n-1) output $Q_{n-1}$, and hold the output signals until the next latch signal Sr is input. Also, (n-1) EXORs 23 are connected with outputs $Q_1$, $Q_2$, $Q_3$, . . . , $Q_{n-1}$ of the (n-1) data flip-flops 24 as inputs. That is to say, (n-1) data flip-flop 24 outputs data flip-flop 1 output $Q_1$ and data flip-flop 2 output $Q_2$ are connected to the inputs of the first EXOR 23, data flip-flop 2 output $Q_2$ and data flip-flop 3 output $Q_3$ are connected to the inputs of the second EXOR 23, . . . , data flip-flop (n-2) output $Q_{n-2}$ and data flip-flop (n-1) output $Q_{n-1}$ are connected to the inputs of the (n-2)'th EXOR 23, and data flip-flop (n-1) output $Q_{n-1}$ and ground are connected to the inputs of the (n-1)'th EXOR 23. Furthermore, variable resonator control signal 1 output $S_1$, variable resonator control signal 2 output $S_2$, variable resonator control signal 3 output $S_3$, . . . , variable resonator control signal (n-1) output $S_{n-1}$ and variable resonator control signal n output $S_n$ are connected respectively to the respective EXOR 23 outputs. That is to say, the other input of EXOR 23 that has the last data flip-flop output connected as an input is always ground. Furthermore, one NAND 22 is connected with (n-1) EXOR 23 outputs EXOR 1 output $S_2$, EXOR 2 output $S_3$, . . . , EXOR (n-2) output $S_{n-1}$, and EXOR (n-1) output $S_n$ as inputs, the output of which is variable resonator control signal 1 output $S_1$.

Figures 6, 7:
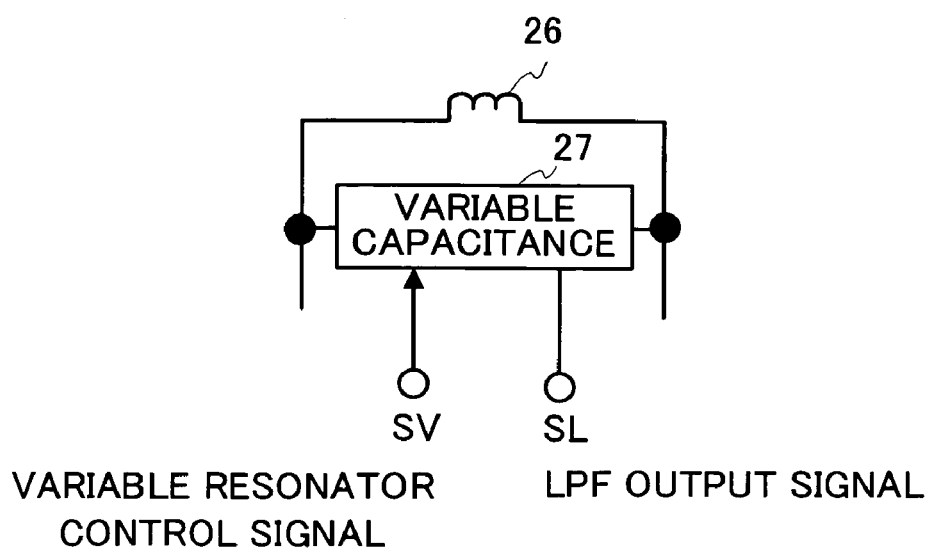
FIG. 6 is a drawing showing an operation table of the data latch circuit shown in FIG. 5.
FIG. 7 is a configuration diagram showing an example of a variable resonator applied to Embodiment 5 of the present invention.

FIG. 6 is a drawing showing an operation table of the data latch circuit shown in FIG. 5. That is to say, FIG. 6 shows in table form the input/output characteristics when EXORs 23 and data flip-flops 24 in FIG. 5 are connected two-by-two. For example, when comparator 1 output $D_1$ is L and comparator 2 output $D_2$ is L, data flip-flop 1 output $Q_1$ is L and data flip-flop 2 output $Q_2$ is L, and therefore variable resonator control signal $S_1$ input to variable resonator 2 in FIG. 1 is H. Thereafter, as shown in FIG. 6, variable resonator control signal $S_1$, $S_2$, or $S_3$ input to variable resonator 2 is H according to the H/L condition of comparator outputs $D_1$ and $D_2$.

Embodiment 5

In Embodiment 5 of the present invention, variable resonator 2 according to Embodiment 1 shown in FIG. 1 is changed, and therefore variable resonator 2 will be described in detail.

FIG. 7 is a configuration diagram showing an example of a variable resonator applied to this Embodiment 5 of the present invention. Variable resonator 2 shown in FIG. 7 has a configuration in which an inductor 26 and variable capacitance 27 are connected in parallel, with an LPF output signal SL and variable resonator control signal SV being input to variable capacitance 27. That is to say, this variable resonator 2 is configured so that a PLL configuration element LPF 8 output signal (LPF output signal SL) and data latch circuit 4 variable resonator control signal SV are input, the capacitance value can be varied according to LPF output signal SL, and the capacitance value change width can be adjusted according to variable resonator control signal SV. By means of such a configuration, the variable resonator control signal generation section generates control signals so that the f/v sensitivity of VCO 1 can be adjusted to an optimal value by controlling variable resonator 2 by Varying LPF output signal SL and variable resonator control signal SV.

Resonance frequency f of variable resonator 2 is expressed by following Equation (1), where L is the value of inductor 26 and C is the value of variable capacitance 27.

$$f = 1/2\pi (LC)^{1/2} \quad \text{[Numeric Expression 1]}$$

Embodiment 6

Figure 8:
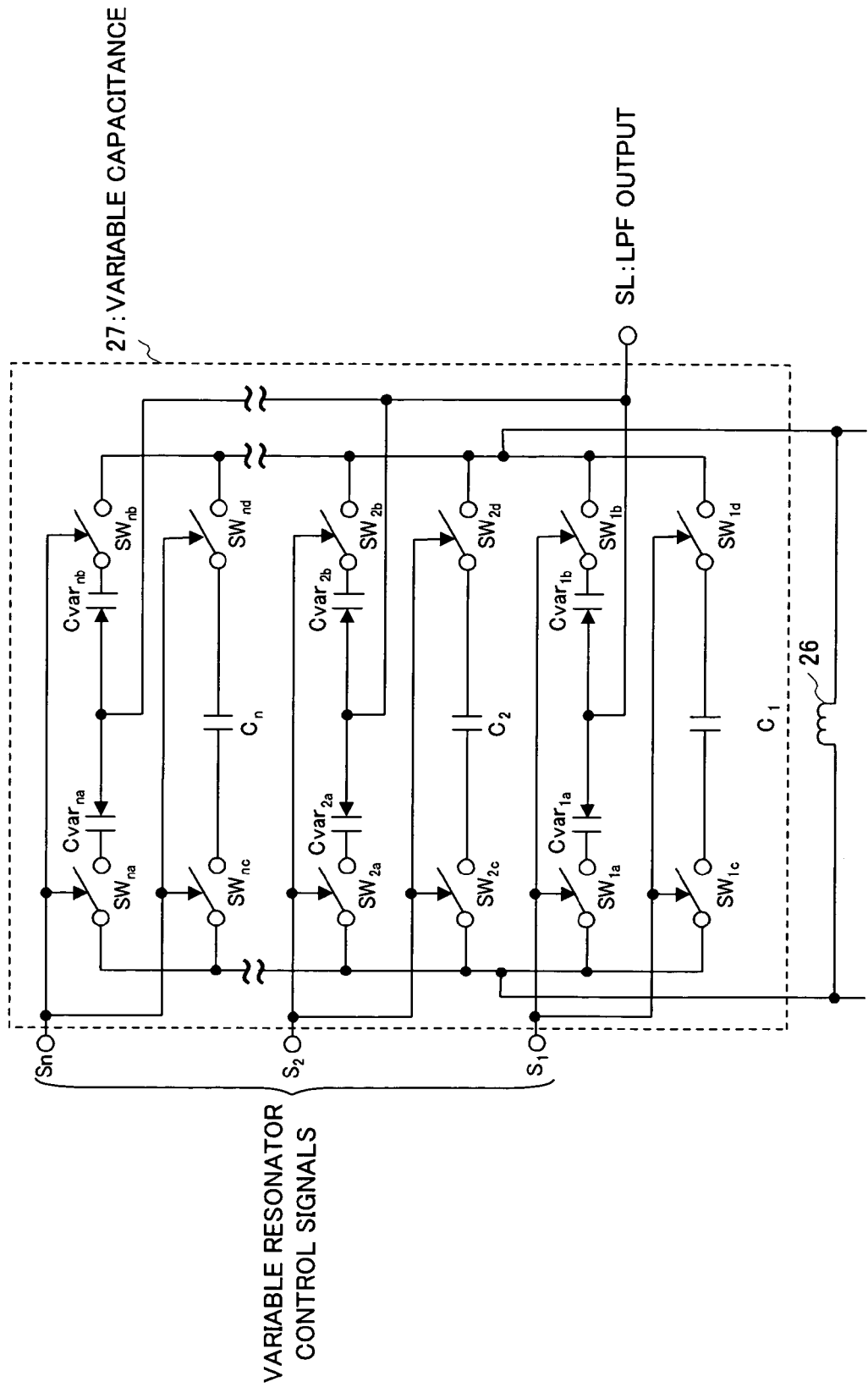
FIG. 8 is a circuit diagram showing an example of a variable capacitance according to Embodiment 6 of the present invention.

FIG. 8 is a circuit diagram showing an example of a variable capacitance according to Embodiment 6 of the present invention. That is to say, FIG. 8 shows a specific example of variable capacitance 27 in FIG. 7. Variable capacitance 27 shown in FIG. 8 comprises first variable capacitance diodes $Cvar_{1a}$ and $Cvar_{1b}$, second variable capacitance diodes $Cvar_{2a}$ and $Cvar_{2b}$, . . . , nth variable capacitance diodes $Cvar_{na}$ and $Cvar_{nb}$; first capacitance $C_1$, second capacitance $C_2$, . . . , nth capacitance $C_n$; and first switches $SW_{1a}$, $SW_{1b}$, $SW_{1c}$, $SW_{1d}$, second switches $SW_{2a}$, $SW_{2b}$, $SW_{2c}$, $SW_{2d}$, . . . , nth switches $SW_{na}$, $SW_{nb}$, $SW_{nc}$, $SW_{nd}$.

ON/OFF control of first switches $SW_1$, second switches $SW_2$, . . . , nth switches $SW_n$, is performed respectively by variable resonator control signals $S_1$, $S_2$, . . . , $S_n$ from the data latch circuit shown in FIG. 5. That is to say, first switches $SW_1$, second switches $SW_2$, . . . , nth switches $SW_n$, are turned off when variable resonator control signals $S_1$, $S_2$, . . . , $S_n$ respectively are L, and are turned on when variable resonator control signals $S_1$, $S_2$, . . . , $S_n$ respectively are H.

The first system of variable capacitance 27 shown in FIG. 8 comprises a first variable capacitance circuit in which a first A switch $SW_{1a}$—first A variable capacitance diode $Cvar_{1a}$ cathode side—first A variable capacitance diode $Cvar_{1a}$ anode side—first B variable capacitance diode $Cvar_{1b}$ anode side—first B variable capacitance diode $Cvar_{1b}$ cathode side—first B switch $SW_{1b}$ series system, and a first C switch $SW_{1c}$—first capacitance C1—first D switch $SW_{1d}$ series system, are connected in parallel. LPF output SL is connected to the point of connection between the anode side of first A variable capacitance diode $Cvar_{1a}$ and the anode side of first B variable capacitance diode $Cvar_{1b}$.

The second system comprises a second variable capacitance circuit in which a second A switch $SW_{2a}$—second A variable capacitance diode $Cvar_{2a}$ cathode side—second A variable capacitance diode $Cvar_{2a}$ anode side—second B variable capacitance diode $Cvar_{2b}$ anode side—second B variable capacitance diode $Cvar_{2b}$ cathode side—second B switch $SW_{2b}$ series system, and a second C switch $SW_{2c}$—second capacitance C2—second D switch $SW_{2d}$ series system, are connected in parallel. LPF output SL is connected to the point of connection between the anode side of second A variable capacitance diode $Cvar_{2a}$ and the anode side of second B variable capacitance diode $Cvar_{2b}$.

The nth system comprises an nth variable capacitance circuit in which an nth A switch $SW_{na}$—nth A variable capacitance diode $Cvar_{na}$ cathode side—nth A variable capacitance diode $Cvar_{na}$ anode side—nth B variable capacitance diode $Cvar_{nb}$ anode side—nth B variable capacitance diode $Cvar_{nb}$ cathode side—nth B switch $SW_{nb}$ series system, and an nth C switch $SW_{nc}$—nth capacitance $C_n$—nth D switch $SW_{nd}$ series system, are connected in parallel. LPF output SL is connected to the point of connection between the anode side of nth A variable capacitance diode $Cvar_{na}$ and the anode side of nth B variable capacitance diode $Cvar_{nb}$.

Figure 9:
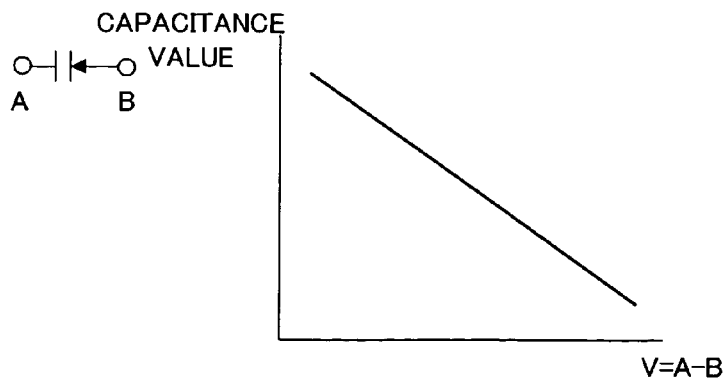
FIG. 9 is a graph showing the voltage dependence characteristic of the variable capacitance diode shown in FIG. 8.

FIG. 9 is a graph showing the voltage dependence characteristic of the variable capacitance diode shown in FIG. 8. A variable capacitance diode is represented by the symbol on the left in FIG. 9, with A indicating the cathode and B indicating the anode. In the voltage dependence characteristic on the right in FIG. 9, potential difference V between cathode A and anode B is represented on the horizontal axis, and the capacitance value of the variable capacitance diode is represented on the vertical axis. When the cathode A voltage is higher than the anode B voltage, the capacitance value of the variable capacitance diode decreases as potential difference V increases, and the capacitance value of the variable capacitance diode increases when potential difference V decreases.

Figure 10:
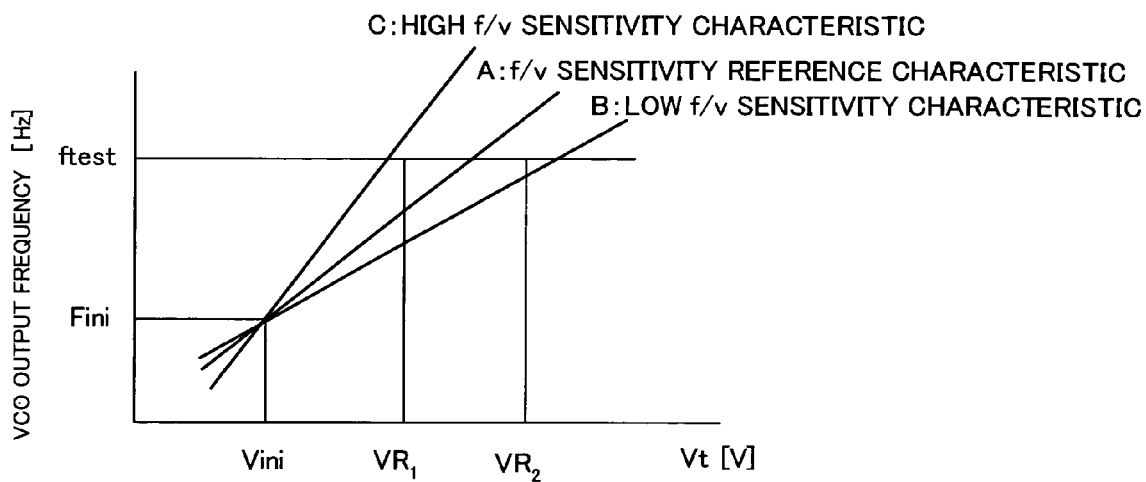
FIG. 10 is a graph showing a characteristic graph of detection of f/v sensitivity of a VCO according to Embodiment 6 of the present invention.

FIG. 10 is a graph showing a characteristic graph of detection of f/v sensitivity of a VCO according to Embodiment 6 of the present invention, with PLL lock voltage Vt (V) represented on the horizontal axis and the VCO output frequency (Hz) represented on the vertical axis. As parameters, f/v sensitivity reference characteristic A, low f/v sensitivity characteristic B, and high f/v sensitivity characteristic C are shown. As the mechanism for detecting the f/v sensitivity of the VCO, the VCO is adjusted so that Vt (the PLL lock voltage) becomes Vini at Fini (set reference channel CH), and the f/v sensitivity is detected by means of the Vt voltage when the PLL is locked at ftest (the detection frequency).

The relationship between the variable capacitance diode and capacitance is as shown in following Equation (2) and Equation (3) when LPF output SL is Vini in FIG. 10. That is to say, when LPF output SL=Vini, $Cvar_1 < Cvar_2 < \ldots < Cvar_n$  [Numeric Expression 2]

$C = Cvar_1/2 + C_1 = Cvar_2/2 + C_2 = \ldots = Cvar_n/2 + C_n$ [Numeric Expression 3]

Figure 11:
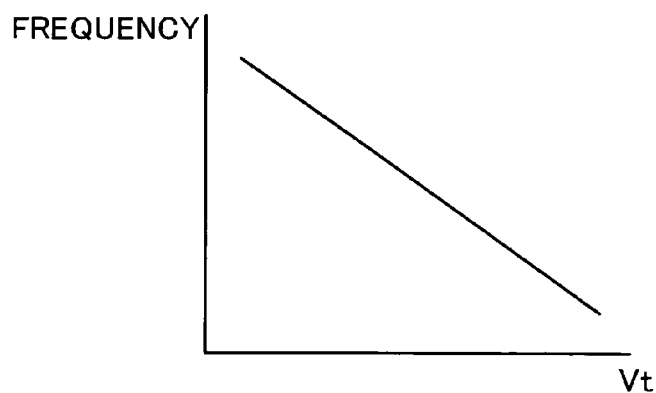
FIG. 11 is a characteristic graph of the resonance frequency of a variable resonator according to Embodiment 6 of the present invention.

FIG. 11 is a characteristic graph of the resonance frequency of a variable resonator according to Embodiment 6 of the present invention, with PLL lock voltage Vt represented on the horizontal axis and the VCO output frequency represented on the vertical axis. This figure is a characteristic graph showing VCO f/v sensitivity when variable resonator 2 in FIG. 7 is applied to variable capacitance 27 in FIG. 8. From above Equation (1) and Equation (3), and the variable capacitance diode voltage dependence characteristic shown in FIG. 9, when the LPF output SL voltage rises the variable capacitance diode capacitance value increases, and therefore the resonance frequency falls. Conversely, when the LPF output SL voltage falls, the variable capacitance diode capacitance value decreases, and therefore the resonance frequency rises. By this means, the f/v sensitivity of the VCO can be controlled to an optimal value.

Embodiment 7

Figure 12:
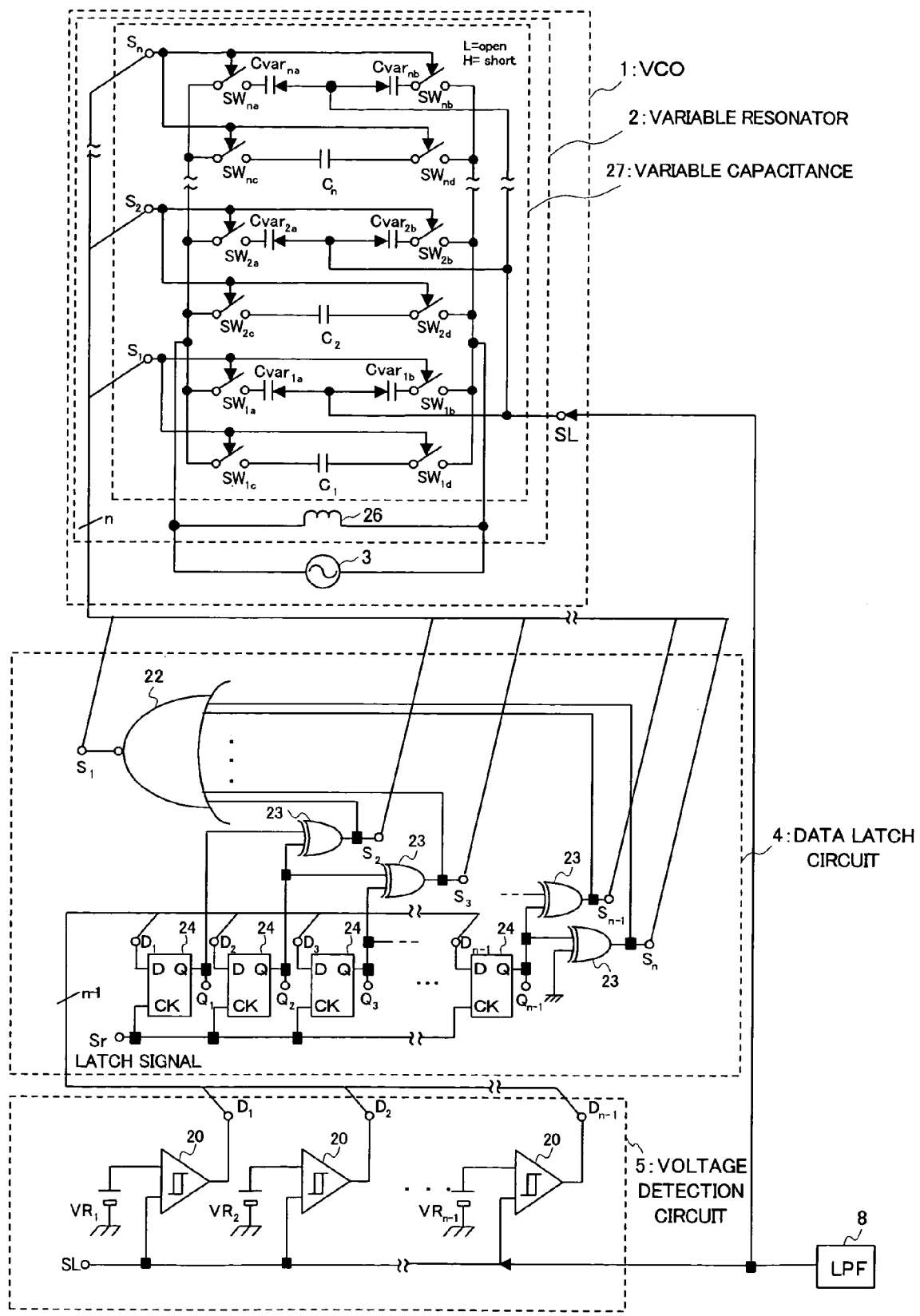
FIG. 12 is a circuit diagram showing an example of a variable capacitance according to Embodiment 7 of the present invention.

FIG. 12 is a circuit diagram showing an implementation of a variable capacitance according to Embodiment 7 of the present invention. That is to say, FIG. 12 is a circuit diagram showing an example of a variable capacitance in which variable resonator automatic adjustment section 11 shown in FIG. 1 is composed of VCO 1, oscillator 3, voltage detection circuit 5 shown in FIG. 3, data latch circuit 4 shown in FIG. 5, variable resonator 2 shown in FIG. 7, and variable capacitance 27 shown in FIG. 8.

In FIG. 12, LPF 8 output is input to LPF output SL of variable capacitance 27 and LPF output SL of voltage detection circuit 5, and the detection result is output to comparator 1 output $D_1$, comparator 2 output $D_2$, comparator (n-1) output $D_{n-1}$ and is connected to inputs indicated by the same reference numerals of data latch circuit 4. Data latch circuit 4 receives a rising edge of latch signal Sr, and outputs signals input to comparator 1 output $D_1$, comparator 2 output $D_2$, ..., comparator (n-1) output $D_{n-1}$, to data flip-flop 1 output $Q_1$, data flip-flop 2 output $Q_2$, data flip-flop 3 output $Q_3$, ..., data flip-flop (n-1) output $Q_{n-1}$. Output signals are held until there is input from latch signal Sr, and EXORs 23 receive outputs from data flip-flops 24 and output EXOR 1 output $S_2$, EXOR 2 output $S_3$, ..., EXOR (n-2) output $S_{n-1}$, and EXOR (n-1) output $S_n$. NAND 22 receives outputs of EXORs 23 and outputs NAND output $S_1$. The EXOR 23 outputs and NAND 22 output are connected to inputs indicated by the same reference numerals of variable capacitance 27 as variable resonator control signal S1, variable resonator control signal $S_2$, ..., variable resonator control signal $S_{n-1}$, and variable resonator control signal $S_n$, and switch first switches $SW_1$, second switches $SW_2$, ..., nth switches $SW_n$.

As stated above, FIG. 10 is a characteristic graph of detection of f/v sensitivity of VCO 1 in the case of a voltage detection circuit that performs binary threshold value detection when two comparators 20 are connected in voltage detection circuit 5 shown in FIG. 3. Therefore the operation when voltage detection circuit 5 and data latch circuit 4 detect the f/v sensitivity of VCO 1 and output a control signal in variable capacitance 27 circuit shown in FIG. 12 will be described using FIG. 10.

As shown in FIG. 10, in the adjustment process VCO 1 is adjusted to reference voltage Vini at reference frequency Fini. In this state, as a test mode in which the f/v sensitivity of VCO 1 is detected, the PLL lock frequency is set to detection frequency $f_{test}$, voltage detection of LPF 8 output is performed by voltage detection circuit 5, and depending on which of the binary threshold values is used for operation, the f/v sensitivity of VCO 1 is detected as f/v sensitivity reference characteristic A, low f/v sensitivity characteristic B, or high f/v sensitivity characteristic C sensitivity.

Data latch circuit 4 has voltage detection circuit 5 output as input, and, in response to a rising edge of a signal input from latch signal Sr, outputs input signals comparator 1 output $D_1$ and comparator 2 output $D_2$ to data flip-flop 1 output $Q_1$ and data flip-flop 2 output $Q_2$. Next, output signals are held until there is input from latch signal Sr, data flip-flop 24 outputs are received, EXOR 1 output $S_2$ and EXOR 2 output $S_3$ are output, EXOR 23 output is received, and NAND output $S_1$ is output. EXOR 23 and NAND 22 outputs are variable resonator 2 control signals, terminate test mode, and terminate the operation that performs control signal output.

By means of this kind of operation, the resonance frequency change width of variable resonator 2 is controlled, and even if the f/v sensitivity of VCO 1 varies in the downward direction as in the case of low f/v sensitivity characteristic B in FIG. 10, by making the proportion of variable capacitance diodes large as in variable capacitance 27 in FIG. 12, the frequency change width with respect to a change in LPF output SL becomes large and therefore the f/v sensitivity becomes high, as a result of which the frequency variability range can be kept optimal.

Embodiment 8

Figure 13:
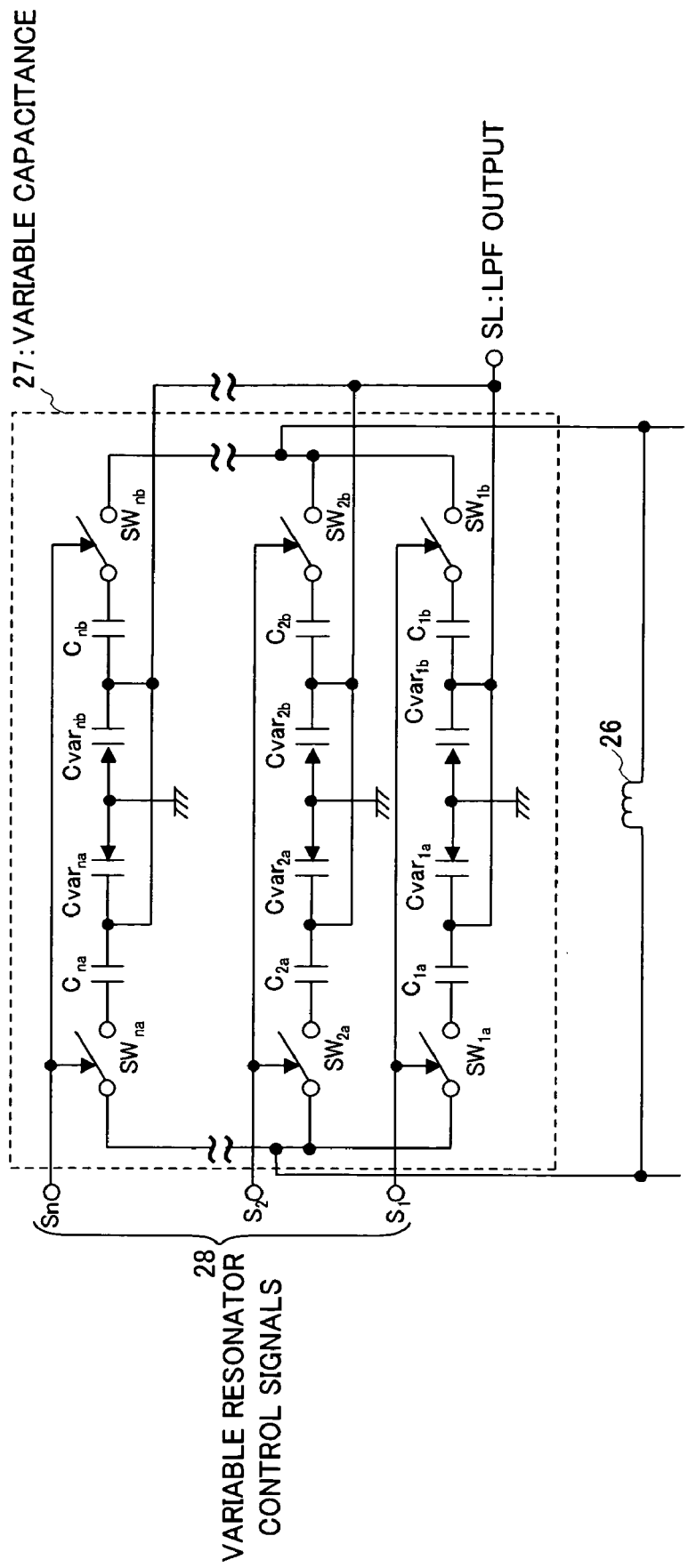
FIG. 13 is a circuit diagram showing an example of a variable capacitance according to Embodiment 8 of the present invention.

FIG. 13 is a circuit diagram showing an example of a variable capacitance according to Embodiment 8 of the present invention. That is to say, FIG. 13 shows a specific example of the variable capacitance in FIG. 7 illustrated in Embodiment 5.

The first system of variable capacitance 27 shown in FIG. 13 comprises a first variable capacitance circuit configured by means of series connection of a first A switch $SW_{1a}$—first A fixed capacitance $C_{1a}$—first A variable capacitance diode $Cvar_{1a}$ cathode side—first A variable capacitance diode $Cvar_{1a}$ anode side—first B variable capacitance diode $Cvar_{1b}$ anode side—first B variable capacitance diode $Cvar_{1b}$ cathode side—first B fixed capacitance $C_{1b}$—first B switch $SW_{1b}$. LPF output SL is connected to the point of connection between first A fixed capacitance $C_{1a}$ and the cathode side of first A variable capacitance diode $Cvar_{1a}$, and the point of connection between the cathode side of first B variable capacitance diode $Cvar_{1b}$ and first B fixed capacitance $C_{1b}$. The point of connection between the anode side of first A variable capacitance diode $Cvar_{1a}$ and the anode side of first B variable capacitance diode $Cvar_{1b}$ is connected to ground.

The second system comprises a second variable capacitance circuit configured by means of series connection of a second A switch $SW_{2a}$—second A fixed capacitance $C_{2a}$—second A variable capacitance diode $Cvar_{2a}$ cathode side—second A variable capacitance diode $Cvar_{2a}$ anode side—second B variable capacitance diode $Cvar_{2b}$ anode side—second B variable capacitance diode $Cvar_{2b}$ cathode side—second B fixed capacitance $C_{2b}$—second B switch $SW_{2b}$. LPF output SL is connected to the point of connection between second A fixed capacitance $C_{2a}$ and the cathode side of second A variable capacitance diode $Cvar_{2a}$, and the point of connection between the cathode side of second B variable capacitance diode $Cvar_{2b}$ and second B fixed capacitance $C_{2b}$. The point of connection between the anode side of second A variable capacitance diode $Cvar_{2a}$ and the anode side of second B variable capacitance diode $Cvar_{2b}$ is connected to ground.

The nth system comprises an nth variable capacitance circuit configured by means of series connection of an nth A switch $SW_{na}$—nth A fixed capacitance $C_{na}$—nth A variable capacitance diode $Cvar_{na}$ cathode side—nth A variable capacitance diode $Cvar_{na}$ anode side—nth B variable capacitance diode $Cvar_{nb}$ anode side—nth B variable capacitance diode $Cvar_{nb}$ cathode side—nth B fixed capacitance $C_{nb}$—nth B switch $SW_{nb}$. LPF output SL is connected to the point of connection between nth A fixed capacitance $C_{na}$ and the cathode side of nth A variable capacitance diode $Cvar_{na}$, and the point of connection between the cathode side of nth B variable capacitance diode $Cvar_{nb}$ and nth B fixed capacitance $C_{nb}$. The point of connection between the anode side of nth A variable capacitance diode $Cvar_{na}$ and the anode side of nth B variable capacitance diode $Cvar_{nb}$ is connected to ground.

ON/OFF control of first switches $SW_{1a}$ and $SW_{1b}$, second switches $SW_{2a}$ and $SW_{2b}$, ..., nth switches $SW_{na}$ and $SW_{nb}$, is performed respectively by variable resonator control signals $S_1, S_2, \ldots, S_n$ from the data latch circuit shown in FIG. 5. That is to say, these switches are turned off when variable resonator control signals $S_1, S_2, \ldots, S_n$ respectively are L, and are turned on when variable resonator control signals $S_1, S_2, \ldots, S_n$ respectively are H.

Above-described FIG. 9 shows the voltage dependence characteristic of the variable capacitance diode shown in FIG. 13. A variable capacitance diode is represented by the symbol on the left in FIG. 9, with A indicating the cathode and B indicating the anode. In the voltage dependence characteristic on the right in FIG. 9, potential difference V between cathode A and anode B is represented on the horizontal axis, and the capacitance value of the variable capacitance diode is represented on the vertical axis. When the cathode A voltage is higher than the anode B voltage, the capacitance value of the variable capacitance diode decreases as potential difference V increases, and the capacitance value of the variable capacitance diode increases when potential difference V decreases. The relationship between the variable capacitance diode and capacitance is as shown in following Equation (4) and Equation (5) when LPF output SL is Vini in FIG. 10. That is to say, when LPF output SL=Vini, $$Cvar_1 > Cvar_2 > \ldots > Cvar_n \qquad \text{[Numeric Expression 4]}$$

$$\begin{aligned}
C &= [1/(1/Cvar_1 + 1/C_1)]/2 \qquad \text{[Numeric Expression 5]} \\
&= [1/(1/Cvar_2 + 1/C_2)]/2 \\
&\vdots \\
&= [1/(1/Cvar_n + 1/C_n)]/2
\end{aligned}$$

Figure 14:
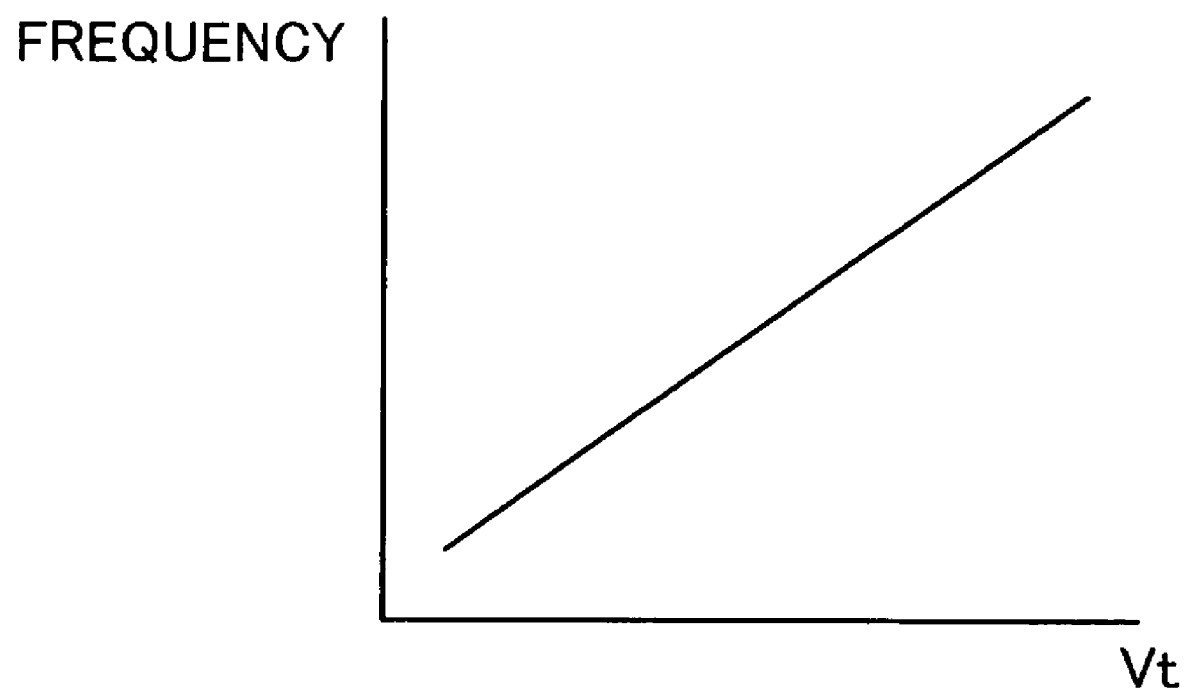
FIG. 14 is a resonance frequency characteristic graph of a variable resonator according to Embodiment 8 of the present invention.

FIG. 14 is a characteristic graph of the resonance frequency of a variable resonator according to Embodiment 8 of the present invention. That is to say, this figure is a characteristic graph showing the f/v sensitivity of VCO 1 when variable resonator 2 in FIG. 7 is applied to variable capacitance 27 in FIG. 13. Horizontal axis "Vt" is the voltage of LPF output SL, and vertical axis "Frequency" is the resonance frequency of variable resonator 2 shown in FIG. 7. From above Equation (1) and Equation (5), and the variable capacitance diode voltage dependence characteristic shown in FIG. 9, when LPF output SL voltage Vt rises, the variable capacitance diode capacitance value decreases, and therefore the resonance frequency rises. Conversely, when LPF output SL voltage Vt falls, the variable capacitance diode capacitance value increases, and therefore the resonance frequency falls.

Embodiment 9

Figure 15:
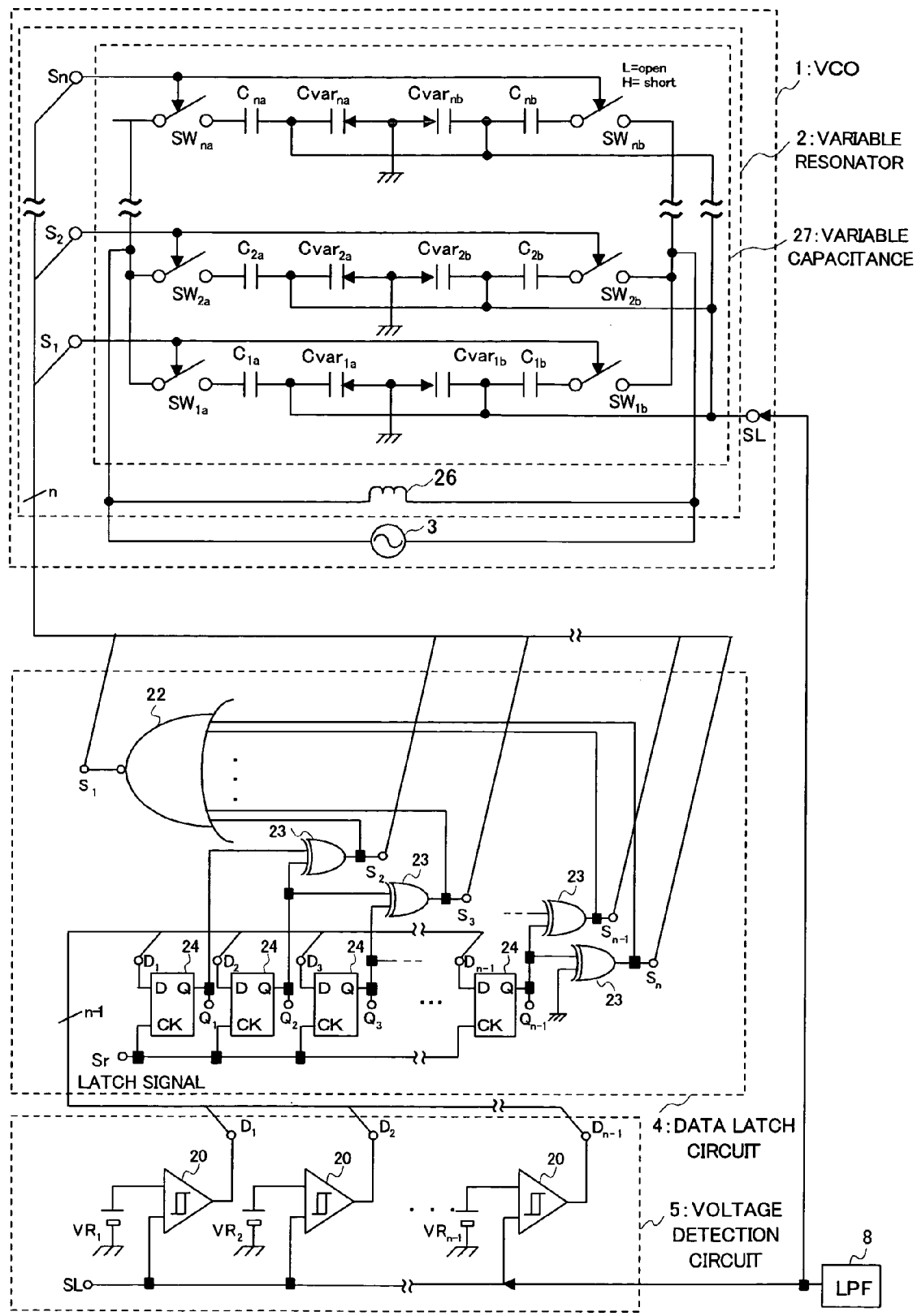
FIG. 15 is a circuit diagram showing an example of a variable capacitance according to Embodiment 9 of the present invention.

FIG. 15 is a circuit diagram showing an example of a variable capacitance according to Embodiment 9 of the present invention. That is to say, FIG. 15 is a circuit diagram in which variable resonator automatic adjustment section 11 shown in FIG. 1 is composed of VCO 1, oscillator 3, voltage detection circuit 5 shown in FIG. 3, data latch circuit 4 shown in FIG. 5, variable resonator 2 shown in FIG. 7, and variable capacitance 27 shown in FIG. 13.

In FIG. 15, LPF 8 output SL, which is VCO 1 input, is input to LPF output SL of variable capacitance 27 and LPF output SL of voltage detection circuit 5, and the detection result is output to comparator 1 output $D_1$, comparator 2 output $D_2, \ldots,$ comparator (n-1) output $D_{n-1}$ and is connected to inputs indicated by the same reference numerals of data latch circuit 4. Data latch circuit 4 receives a rising edge of latch signal Sr, and outputs signals input to comparator 1 output $D_1$, comparator 2 output $D_2$, ..., comparator (n-1) output $D_{n-1}$, to data flip-flop 1 output $Q_1$, data flip-flop 2 output $Q_2$, data flip-flop 3 output $Q_3$, ..., data flip-flop (n-1) output Data latch circuit 4 then holds output signals until there is input from latch signal Sr, and EXORs 23 receive outputs from data flip-flops 24 and output EXOR 1 output $S_2$, EXOR 2 output $S_3$, ..., EXOR (n-2) output $S_{n-1}$, and EXOR (n-1) output $S_n$. NAND 22 receives outputs of EXORs 23 and outputs NAND output $S_1$. The EXOR 23 outputs and NAND 22 output are connected to inputs indicated by the same reference numerals of variable capacitance 27 as variable resonator control signal $S_1$, variable resonator control signal $S_2$, ..., variable resonator control signal $S_{n-1}$, and variable resonator control signal $S_n$, and switch first switches $SW_1$, second switches $SW_2$, ..., nth switches $SW_n$.

Above-described FIG. 10 is a characteristic graph of detection of f/v sensitivity of VCO 1 in the case of a voltage detection circuit that performs binary threshold value detection when two comparators 20 are connected in voltage detection circuit 5 shown in FIG. 3. Therefore the operation when voltage detection circuit 5 and data latch circuit 4 detect The f/v sensitivity of VCO 1 and output a control signal in the variable capacitance circuit shown in FIG. 15 will be described using FIG. 10.

As shown in FIG. 10, in the adjustment process VCO 1 is adjusted to reference voltage Vini at reference frequency Fini. In this state, as a test mode in which The f/v sensitivity of VCO 1 is detected, the PLL lock frequency is set to detection frequency ftest, voltage detection of LPF 8 output is performed by voltage detection circuit 5, and depending on which of the binary threshold values is used for operation, The f/v sensitivity of VCO 1 is detected as f/v sensitivity reference characteristic A, low f/v sensitivity characteristic B, or high f/v sensitivity characteristic C sensitivity.

Data latch circuit 4 has voltage detection circuit 5 output as input, receives a rising edge of a signal input from latch signal Sr and outputs input signals comparator 1 output $D_1$ and comparator 2 output $D_2$ to data flip-flop 1 output $Q_1$ and data flip-flop 2 output $Q_2$, then holds output signals until there is input from latch signal Sr, receives data flip-flop 24 outputs, outputs EXOR 1 output $S_2$ and EXOR 2 output $S_3$, receives EXOR 23 output, and outputs NAND output $S_1$. EXOR 23 and NAND 22 outputs are variable resonator 2 control signals, terminate test mode, and terminate the operation that performs control signal output.

By means of this kind of operation, the resonance frequency change width of variable resonator 2 is controlled, and even if the f/v sensitivity of voltage controlled oscillator 1 varies in the upward direction as in the case of high f/v sensitivity characteristic C in FIG. 10, by making the proportion of variable capacitance diodes of variable capacitance 27 shown in FIG. 15 large, the frequency change width with respect to a change in LPF output SL becomes small and therefore the f/v sensitivity of VCO 1 becomes low, as a result of which the frequency variability range can be kept optimal.

Embodiment 10

Figure 16:
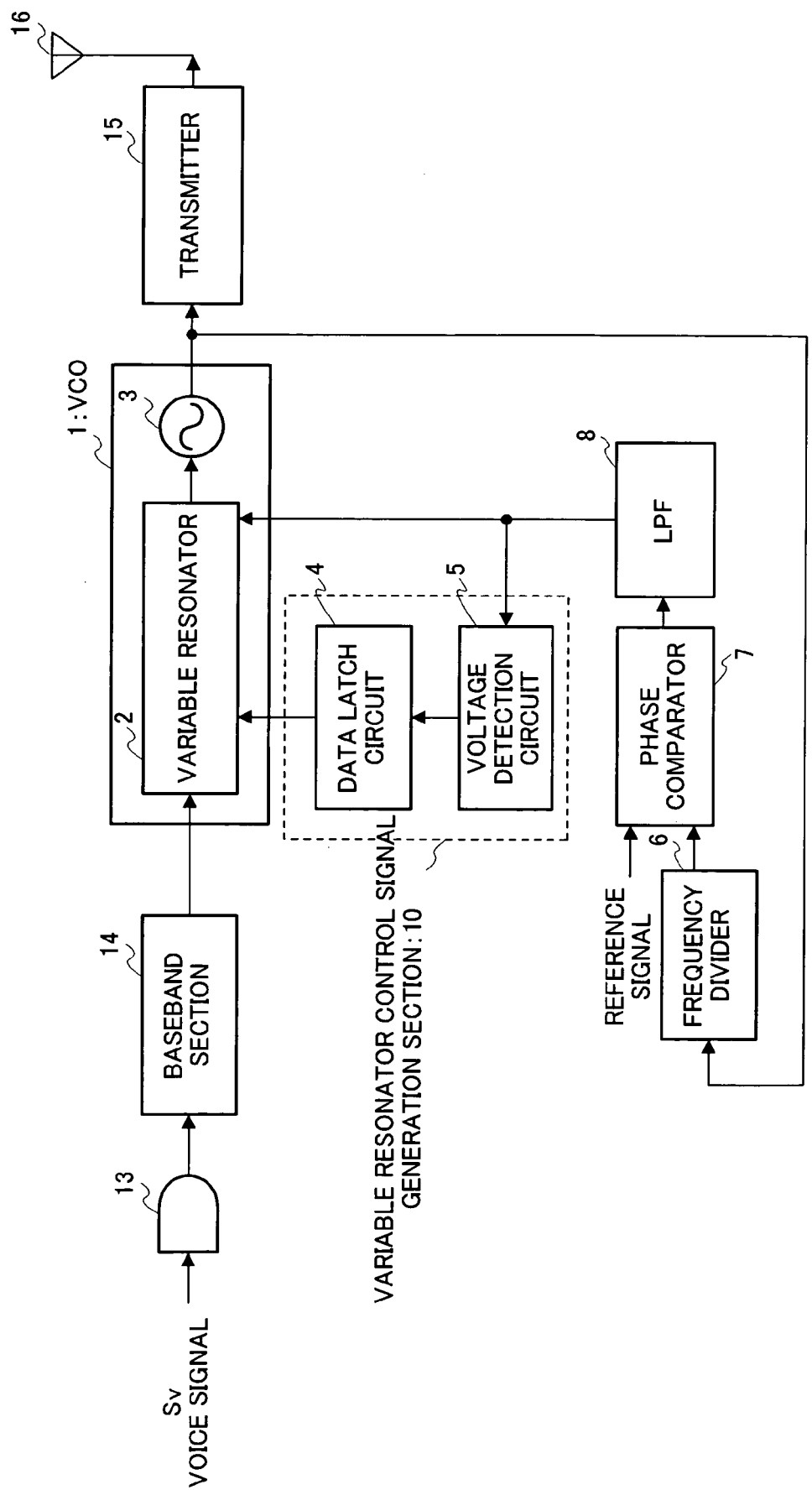
FIG. 16 is a block diagram showing the configuration of an oscillation control apparatus and transmitting apparatus according to Embodiment 10 of the present invention.

FIG. 16 is a block diagram showing the configuration of an oscillation control apparatus and transmitting apparatus according to Embodiment 10 of the present invention.

As compared with the oscillation control apparatus shown in FIG. 1, the configuration in FIG. 16 features the addition of a transmitting apparatus composed of a microphone 13 to which a voice signal Sv is input, a baseband section 14, a transmitter 15, and an antenna 16. That is to say, in the configuration in FIG. 16, there are connected to the oscillation control apparatus applied to Embodiment 2 as shown in FIG. 1 microphone 13 to which voice signal Sv is input, and baseband section 14 that performs voice signal processing with the output of microphone 13 as input and outputs a modulated signal to the oscillation control apparatus, and furthermore transmitter 15 and antenna 16 are connected to the output of the oscillation control apparatus.

In FIG. 16, when voice signal Sv is input to microphone 13, the output from microphone 13 is input to baseband section 14 and undergoes baseband processing, and is output to the oscillation control apparatus as a modulated signal. A modulated transmit signal output from the oscillation control apparatus is subjected to limitation to a predetermined transmission frequency bandwidth by transmitter 15, is amplified, and is transmitted in space via antenna 16. At this time, the f/v sensitivity of VCO 1 is adjusted to an optimal value.

Embodiment 11

Figure 17:
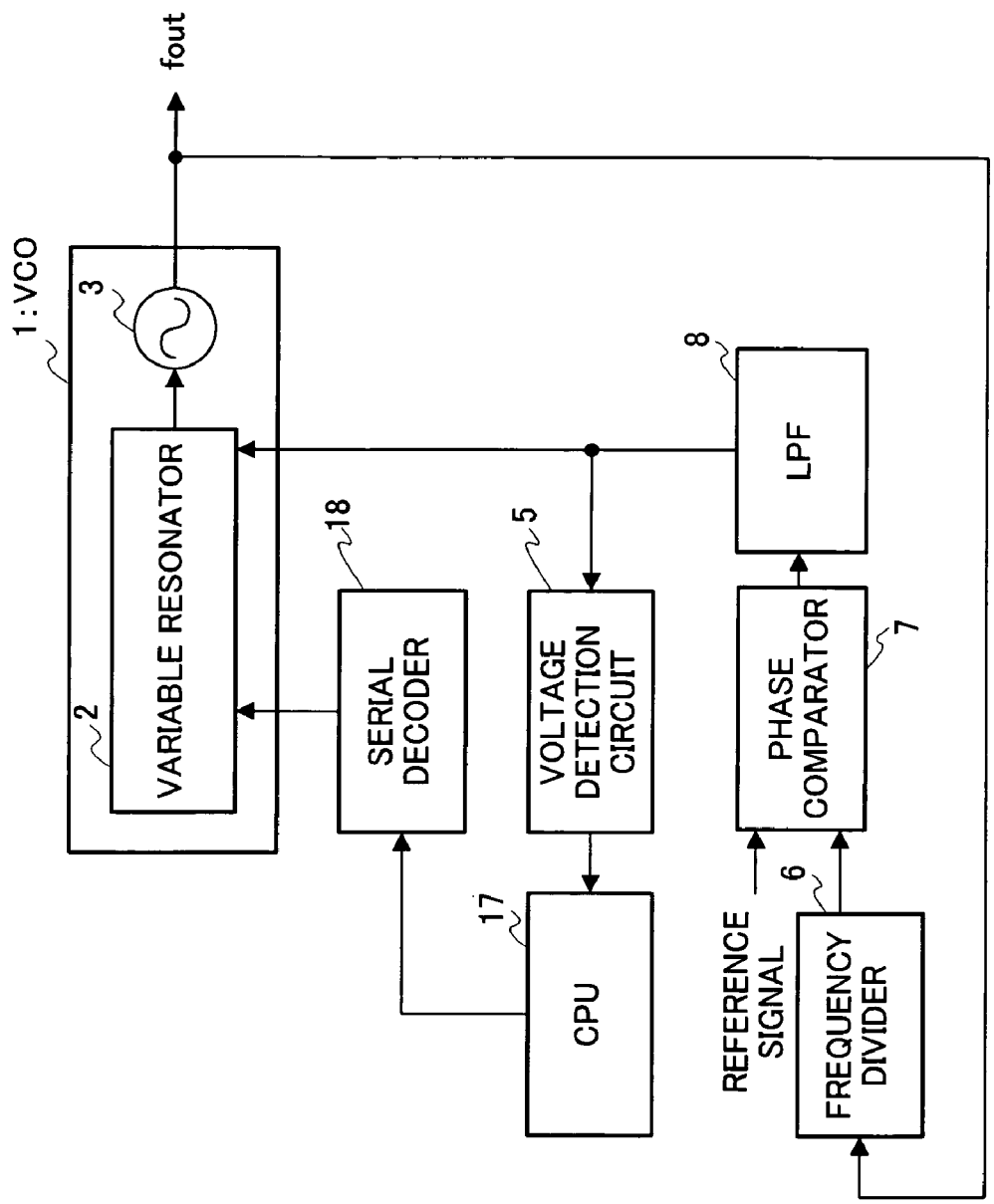
FIG. 17 is a block diagram showing the configuration of an oscillation control apparatus according to Embodiment 11 of the present invention.

FIG. 17 is a block diagram showing the configuration of an oscillation control apparatus according to Embodiment 11 of the present invention. Configuration elements in FIG. 17 identical to those in FIG. 1 are assigned the same reference numerals as in FIG. 1 and descriptions thereof are omitted here.

In the oscillation control apparatus shown in FIG. 17, variable resonator control signal generation section 10 of the oscillation control apparatus shown in FIG. 1 has been changed, and therefore only the changes are described here. That is to say, in the oscillation control apparatus shown in FIG. 17, part of variable resonator control signal generation section 10 has been changed and a CPU 17 and serial decoder 18 have been added.

A particular feature of the oscillation control apparatus of Embodiment 11 shown in FIG. 17 is the provision of voltage detection circuit 5 that has an output signal of PLL configuration element LPF 8 as input and detects a predetermined threshold voltage, CPU 17 that has voltage detection circuit 5 output as input and outputs predetermined serial data according to the result of comparison with a predetermined threshold voltage, and serial decoder 18 that has serial data output by CPU 17 as input, performs serial/parallel conversion, and controls the resonance frequency change width of variable resonator 2. CPU 17 has a function of generating serial data such that the variable resonator 2 resonance frequency change width is increased when the f/v sensitivity of VCO 1 varies in the downward direction, and is decreased when the f/v sensitivity of VCO 1 varies in the upward direction.

Figure 18:
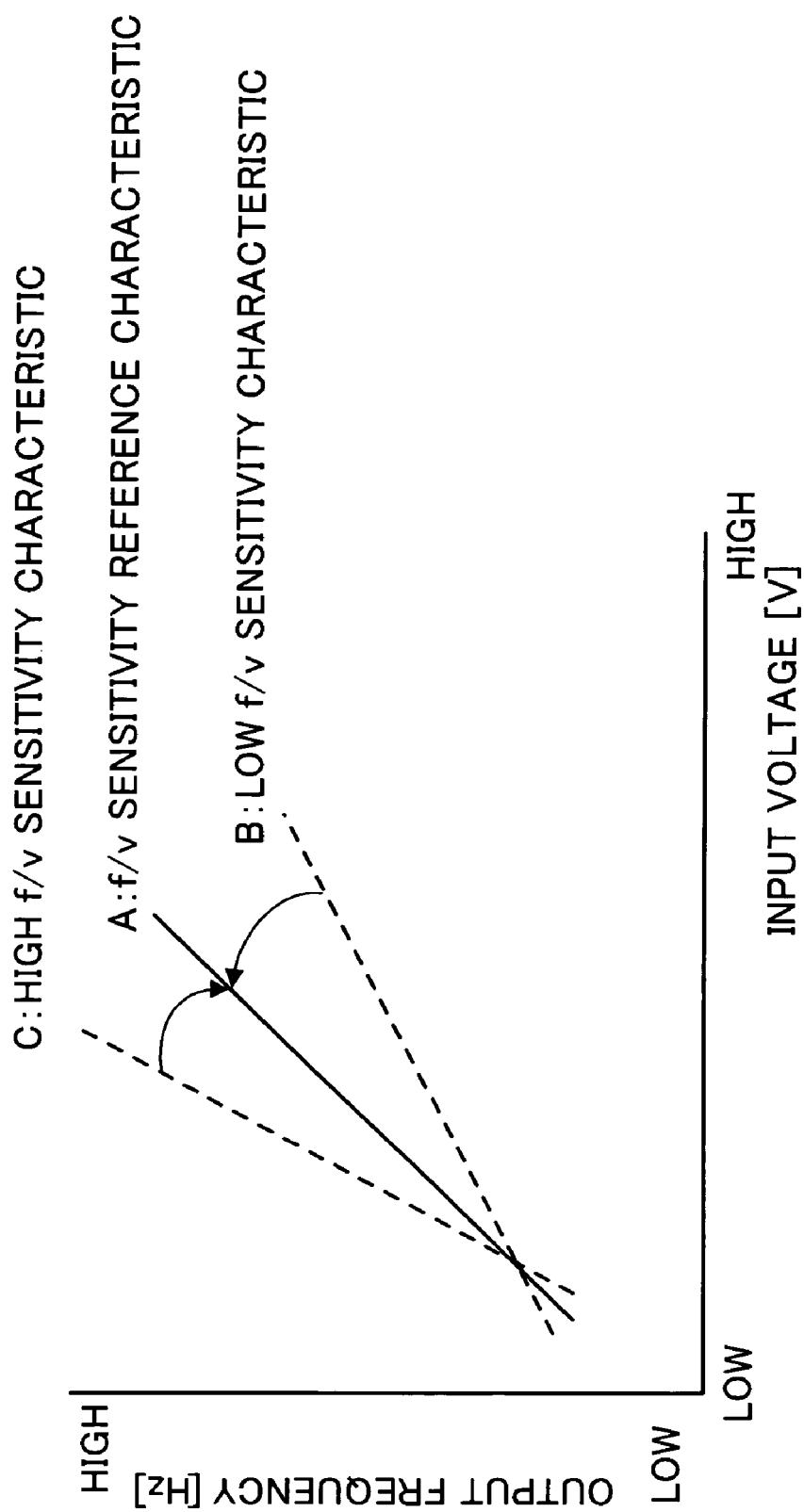
FIG. 18 is a graph of the VCO f/v sensitivity characteristic realized by Embodiment 11 of the present invention.

FIG. 18 is a graph of the VCO f/v sensitivity characteristic realized by Embodiment 11 of the present invention, with input voltage (V) represented on the horizontal axis and output frequency (Hz) on the vertical axis.

As shown in FIG. 18, when the f/v sensitivity of VCO 1 varies in the downward direction as illustrated by low f/v sensitivity characteristic B, f/v sensitivity reference characteristic A is attained by increasing the resonance frequency change width of the variable resonator by means of CPU 17 control, and when the f/v sensitivity of VCO 1 varies in the upward direction as illustrated by high f/v sensitivity characteristic C, f/v sensitivity reference characteristic A is attained by decreasing the resonance frequency change width of the variable resonator, enabling PLL characteristic degradation to be prevented.

Embodiment 12

Figure 19:
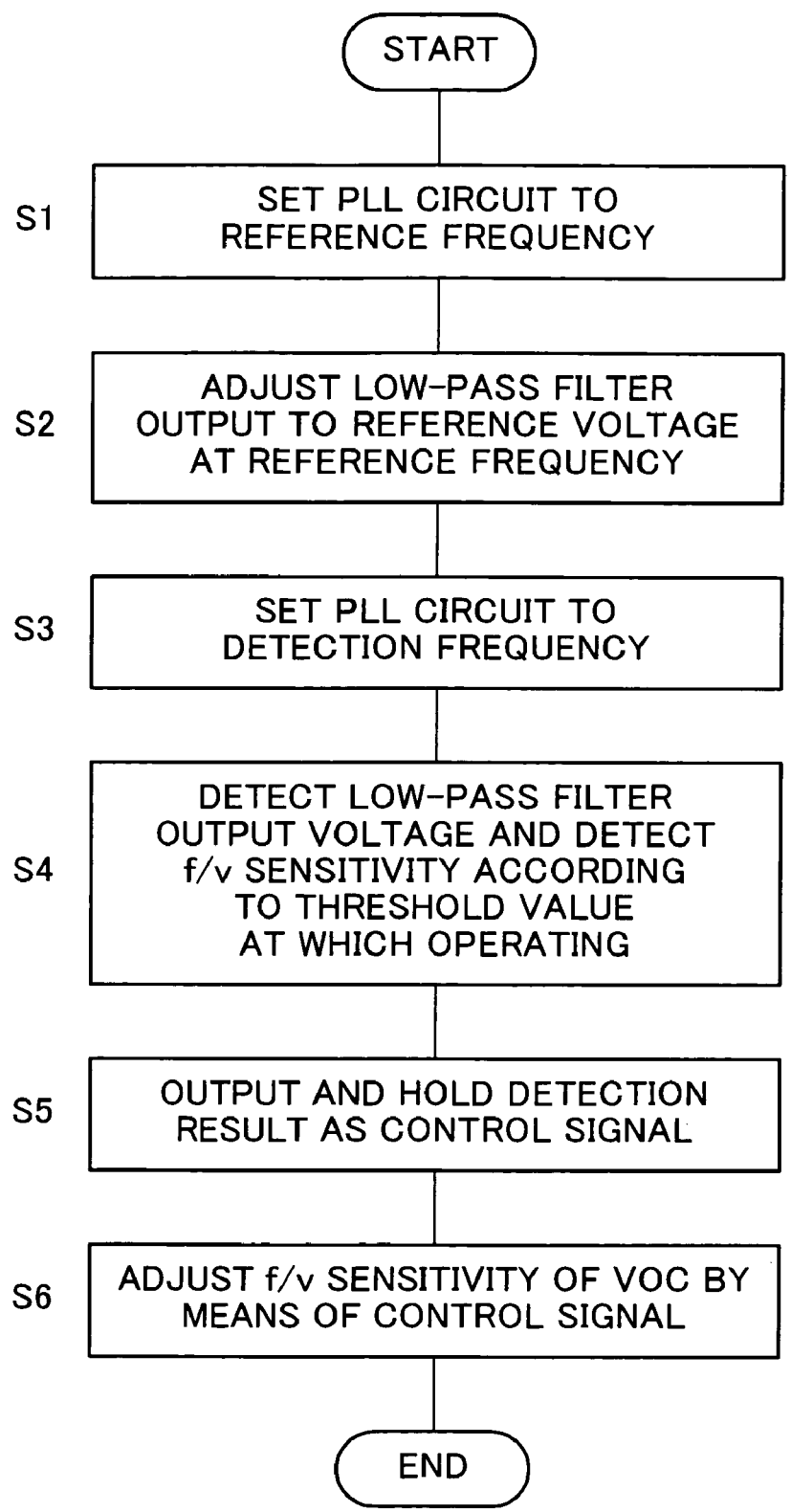
FIG. 19 is a flowchart showing a method of adjustment of f/v sensitivity of an oscillation control apparatus according to Embodiment 12 of the present invention.
Figure 20:
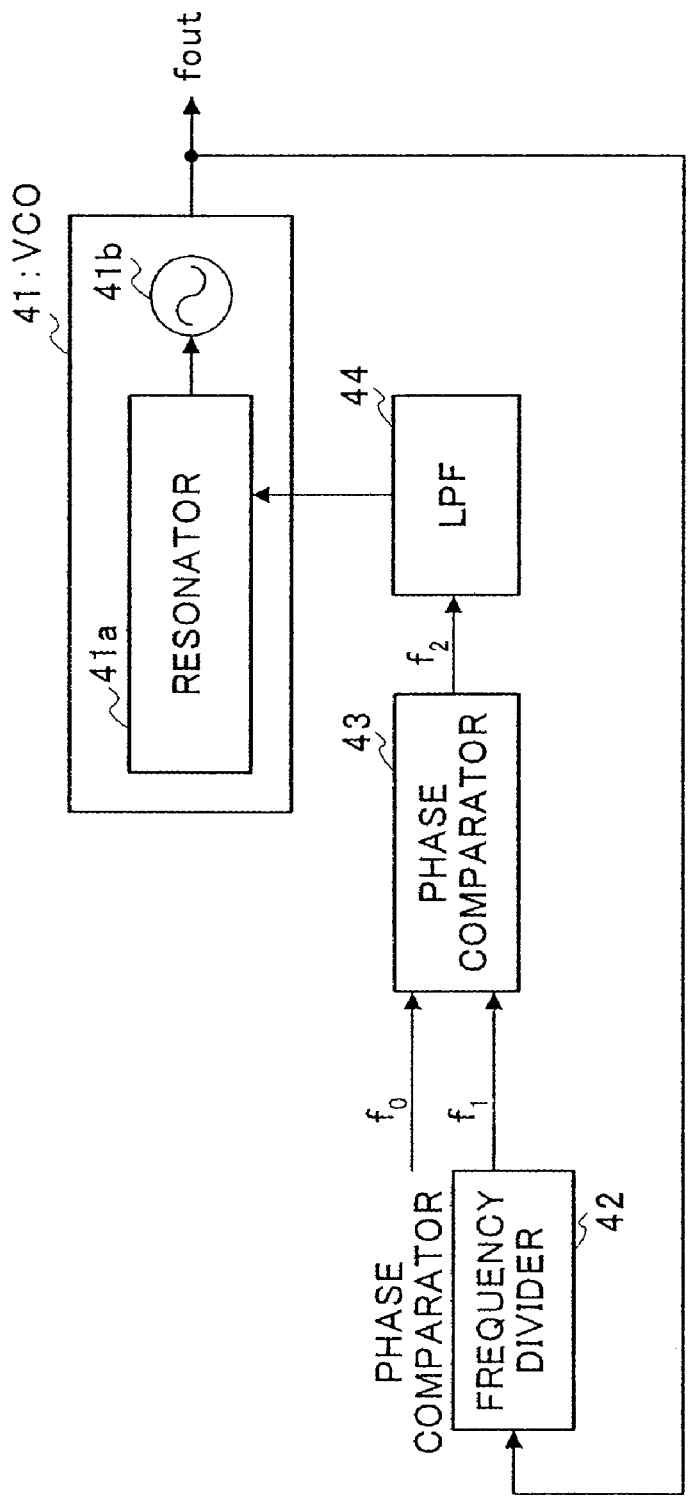
FIG. 20 is a block diagram showing the configuration of a conventional oscillation control apparatus.
Figure 21:
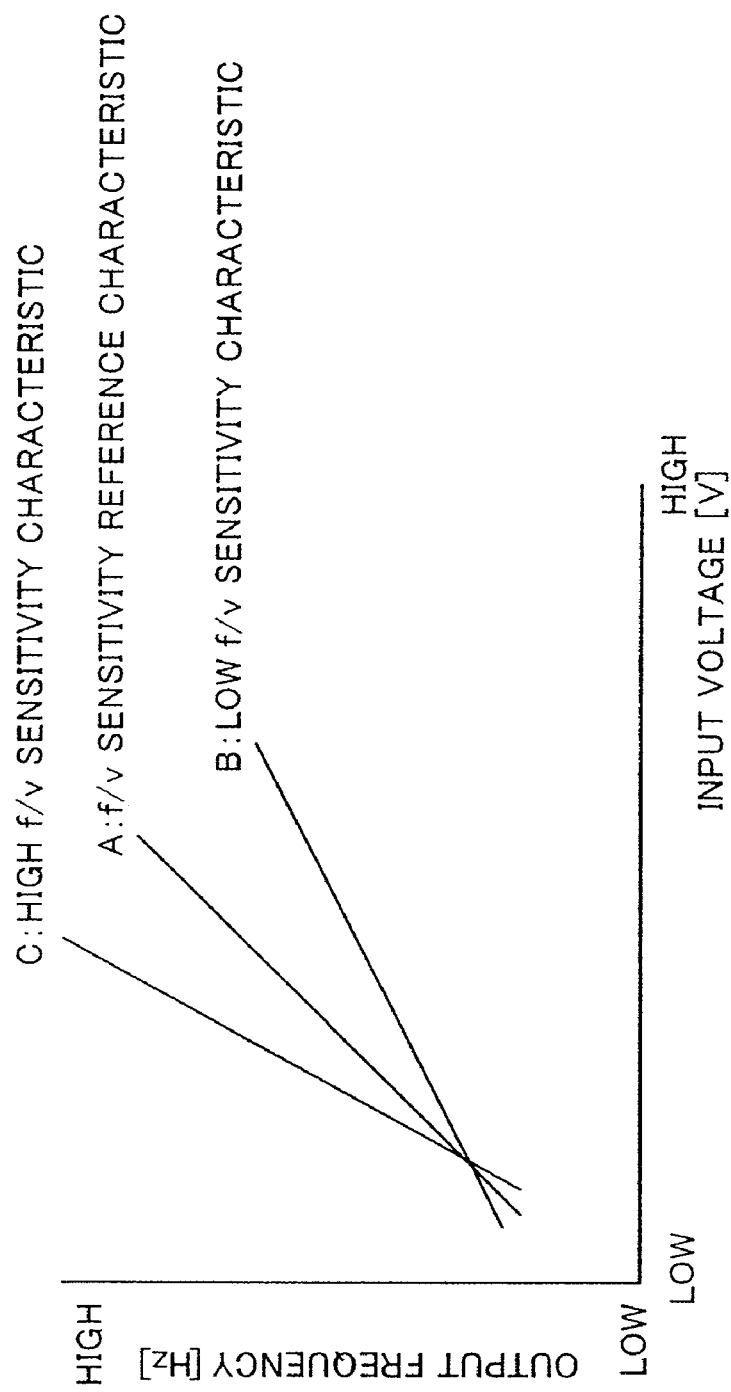
FIG. 21 is a graph showing variation of f/v sensitivity in a conventional VCO.

FIG. 19 is a flowchart showing a method of adjustment of f/v sensitivity of an oscillation control apparatus according to Embodiment 12 of the present invention.

In the procedure for detecting and adjusting variation of the f/v sensitivity of VCO 1, the PLL circuit is first set to reference frequency Fini shown in FIG. 10 (step S1), then PLL circuit configuration element VCO 1 is adjusted to reference voltage Vini at reference frequency Fini (step S2), and the PLL circuit is set to detection frequency ftest (step S3).

Then voltage detection of the LPF output is performed at a predetermined threshold, and depending on the threshold value at which operation is performed, the f/v sensitivity of VCO 1 is detected as f/v sensitivity reference characteristic A, low f/v sensitivity characteristic B, or high f/v sensitivity characteristic C sensitivity (step S4). The voltage detection result is held as control signal output (step S5). Then, in order to adjust the resonance frequency change width of the resonator according to the detection result, the f/v sensitivity of VCO 1 is adjusted to an optimal value by increasing the resonance frequency change width of the resonator if the f/v sensitivity varies in the downward direction, or decreasing the resonance frequency change width of the resonator if the f/v sensitivity varies in the upward direction (step S6).

According to this kind of adjustment method, when the f/v sensitivity of voltage controlled oscillator 1 varies in the downward direction as illustrated by low f/v sensitivity characteristic B in FIG. 18, narrowing of the frequency variability range can be prevented and f/v sensitivity reference characteristic A can be attained by increasing the resonance frequency change width of the resonator. Similarly, when the f/v sensitivity of voltage controlled oscillator 1 varies in the upward direction as illustrated by high f/v sensitivity characteristic C, C/N degradation can be prevented and f/v sensitivity reference characteristic A can be attained by decreasing the resonance frequency change width of the resonator. As a result, degradation of PLL characteristics can be prevented and stable operation can be achieved.

Thus, an oscillation control apparatus and f/v sensitivity adjustment method according to the present invention automatically adjust variation of VCO f/v sensitivity, prevent PLL characteristic degradation due to variation, and provide stable PLL operation, and can therefore be used effectively in a transmitting apparatus or the like.

The present invention is not limited to the above-described embodiments, and various variations and modifications may be possible without departing from the scope of the present invention.

This application is based on Japanese Patent Application No. 2004-363702 filed on Dec. 15, 2004, the entire content of which is expressly incorporated by reference herein.

What is claimed is:

1. An oscillation control apparatus equipped with a PLL, comprising:
   a voltage controlled oscillator that has a variable resonator that changes f/v sensitivity according to a control signal;
   a frequency divider that performs a frequency division of a frequency of an entered output signal of said voltage controlled oscillator;
   a phase comparator that performs phase comparison between an entered output signal of said frequency divider and a entered reference signal; and
   a low-pass filter receiving an output signal of said phase comparator and outputs a control voltage to said voltage controlled oscillator, wherein said oscillation control apparatus has a variable resonator control signal generation section that has an output signal of said low-pass filter as input and detects f/v sensitivity of said voltage controlled oscillator, and generates a control signal for controlling said variable resonator based on detected f/v sensitivity, said variable resonator control signal generation section generating a control signal that increases a resonance frequency change width of said variable resonator and raises f/v sensitivity so that f/v sensitivity becomes a reference value when f/v sensitivity of said voltage controlled oscillator varies in a downward direction, and generates a control signal that decreases a resonance frequency change width of said variable resonator and lowers f/v sensitivity so that f/v sensitivity becomes a reference value when f/v sensitivity of said voltage controlled oscillator varies in an upward direction.

2. An oscillation control apparatus equipped with a PLL, comprising:
   a voltage controlled oscillator that has a variable resonator that changes f/v sensitivity according to a control signal;
   a frequency divider that performs a frequency division of a frequency of an entered output signal of said voltage controlled oscillator;
   a phase comparator that performs phase comparison between an entered output signal of said frequency divider and a entered reference signal; and
   a low-pass filter receiving an output signal of said phase comparator and outputs a control voltage to said voltage controlled oscillator, wherein said oscillation control apparatus has a variable resonator control signal generation section that has an output signal of said low-pass filter as input and detects f/v sensitivity of said voltage controlled oscillator, and generates a control signal for controlling said variable resonator based on detected f/v sensitivity, said variable resonator control signal generation section comprising:
   a voltage detection circuit that receives an output signal of said low-pass filter and detects a predetermined voltage; and
   a data latch circuit that receives an output signal of said voltage detection circuit and holds data of the received signal, and outputs a control signal to said variable resonator.

3. The oscillation control apparatus according to claim 2 wherein said variable resonator is configured by parallel connection of: a variable capacitance circuit that changes a amount of a capacitance value change in accordance with a control signal from said data latch circuit; and a fixed inductor.

4. The oscillation control apparatus according to claim 3, wherein said variable capacitance circuit includes at least two independent systems comprising a switch circuit, controlled by said control signal, connected in parallel to both ends of a parallel circuit of a fixed capacitance element and a variable capacitance element that changes capacitance in accordance with an output signal of said low-pass filter, and changes said capacitance by means of said control signal of respective independent systems.

5. The oscillation control apparatus according to claim 3, wherein said variable capacitance circuit has a first fixed capacitance element, a first variable capacitance element that changes capacitance in accordance with an output signal of said low-pass filter, a second variable capacitance element that changes capacitance in accordance with an output signal of said low-pass filter, and a second fixed capacitance element connected in series, and has a switch circuit controlled by said control signal at both ends thereof.

6. The oscillation control apparatus according to claim 1, wherein said variable resonator control signal generation section comprises:
   a voltage detection circuit that has an output signal of said low-pass filter as an input and detects a predetermined voltage;
   a CPU that has an output signal of said voltage detection circuit as an input and outputs predetermined serial data in accordance with a detection result; and
   a serial decoder that has an output signal of said CPU as an input and outputs a control signal to said resonator.

7. A transmitting apparatus that performs FM signal modulation/demodulation, comprising the oscillation control apparatus according to claim 1.

8. The transmitting apparatus according to claim 7, comprising:
   said PLL;
   a microphone that has a voice signal as an input and performs conversion thereof to an electrical signal;
   a baseband section that has an output signal of said microphone as an input and performs voice processing;
   a transmitter that has an output signal of said voltage controlled oscillator as an input and performs amplification and band-limiting;
   an antenna that has an output signal of said transmitter as an input and outputs a transmit signal into space; and
   a control signal generation section that has an output signal of said low-pass filter being a component of said PLL as an input, detects f/v sensitivity of said voltage controlled oscillator, and generates a control signal of said variable resonator.

9. An f/v sensitivity adjustment method of an oscillation control apparatus that performs adjustment of f/v sensitivity in a voltage controlled oscillator that has a variable resonator, said f/v sensitivity adjustment method comprising:
   detecting a variation of f/v sensitivity of said voltage controlled oscillator; and
   adjusting said f/v sensitivity to an optimal value by changing a resonance frequency change width of said variable resonator based on a detection result.

10. An f/v sensitivity adjustment method of an oscillation control apparatus that performs adjustment of f/v sensitivity in a voltage controlled oscillator that includes a variable resonator, said f/v sensitivity adjustment method comprising:
   setting a PLL circuit to a reference frequency;
   setting an output signal of a low-pass filter included in said PLL circuit to a reference voltage at said reference frequency;
   setting said PLL circuit to a detection frequency;
   detecting an output voltage of said low-pass filter, and detecting f/v sensitivity based on an operating threshold value;
   maintaining a detection result as a control signal; and
   adjusting said f/v sensitivity to an optimal value by changing a resonance frequency change width of said variable resonator based on said control signal.

* * * * *